(12) United States Patent
Gieskes et al.

(10) Patent No.: US 9,986,670 B2
(45) Date of Patent: May 29, 2018

(54) FLEXIBLE ASSEMBLY MACHINE, SYSTEM AND METHOD

(71) Applicant: UNIVERSAL INSTRUMENTS CORPORATION, Conklin, NY (US)

(72) Inventors: Koenraad Alexander Gieskes, Deposit, NY (US); John Edward Danek, Vestal, NY (US)

(73) Assignee: UNIVERAL INSTRUMENTS CORPORATION, Conklin, NY (US)

( * ) Notice: Subject to any disclaimer, the term of this patent is extended or adjusted under 35 U.S.C. 154(b) by 0 days. days.

(21) Appl. No.: 14/568,786

(22) Filed: Dec. 12, 2014

(65) Prior Publication Data

US 2015/0173260 A1 Jun. 18, 2015

Related U.S. Application Data

(63) Continuation of application No. 14/407,621, filed as application No. PCT/US2013/048196 on Jun. 27, 2013.
(Continued)

(51) Int. Cl.
*H05K 13/04* (2006.01)
*G01C 9/06* (2006.01)
(Continued)

(52) U.S. Cl.
CPC .......... *H05K 13/0413* (2013.01); *B23P 21/00* (2013.01); *B23P 21/004* (2013.01);
(Continued)

(58) Field of Classification Search
CPC ..... H05K 13/04–13/0413; H05K 13/08; Y10T 29/4913; Y10T 29/53174; B23P 21/004
See application file for complete search history.

(56) References Cited

U.S. PATENT DOCUMENTS

| 4,261,681 A | 4/1981 | Gates |
| 4,396,945 A | 8/1983 | Dimatteo et al. |

(Continued)

FOREIGN PATENT DOCUMENTS

| CN | 1316927 A | 10/2001 |
| CN | 1438835 A | 8/2003 |

(Continued)

OTHER PUBLICATIONS

Restriction Requirement for U.S. Appl. No. 14/568,669, filed Dec. 12, 2014, dated Mar. 11, 2016.
(Continued)

*Primary Examiner* — Livius R Cazan
(74) *Attorney, Agent, or Firm* — Schmeiser, Olsen & Watts, LLP

(57) ABSTRACT

A dispensing head is disclosed including a control system located in the dispensing head, an encoder read head located in the dispensing head, and a light-capture sensor located in the dispensing head configured to detect a light flash of a stationary camera when the light flash illuminates a component on the dispensing head or an element of the dispensing head. The control system is configured to determine a precise encoder position with the encoder read head at a moment of the light flash. The dispensing head is configured to at least partially assemble an unfinished product. An assembly machine having the dispensing head and a method of at least partially assembling an unfinished product with the dispensing head is further disclosed.

19 Claims, 11 Drawing Sheets

Related U.S. Application Data

(60) Provisional application No. 61/665,488, filed on Jun. 28, 2012.

(51) Int. Cl.

| | | |
|---|---|---|
| *B25J 19/02* | (2006.01) | |
| *B25J 11/00* | (2006.01) | |
| *B65G 35/00* | (2006.01) | |
| *H05K 13/08* | (2006.01) | |
| *B25J 5/02* | (2006.01) | |
| *B23P 21/00* | (2006.01) | |

(52) U.S. Cl.
CPC ............... *B25J 5/02* (2013.01); *B25J 11/00* (2013.01); *B25J 19/02* (2013.01); *B65G 35/00* (2013.01); *G01C 9/06* (2013.01); *H05K 13/0408* (2013.01); *H05K 13/0495* (2013.01); *H05K 13/08* (2013.01); *Y10T 29/4913* (2015.01); *Y10T 29/49124* (2015.01); *Y10T 29/49133* (2015.01); *Y10T 29/53174* (2015.01); *Y10T 29/53417* (2015.01)

(56) References Cited

U.S. PATENT DOCUMENTS

| | | | |
|---|---|---|---|
| 4,397,385 | A | 8/1983 | Booth et al. |
| 4,527,324 | A | 7/1985 | Dean et al. |
| 4,706,379 | A | 11/1987 | Seno et al. |
| 4,728,135 | A | 3/1988 | Sugimura et al. |
| 4,794,689 | A | 1/1989 | Seno et al. |
| 4,949,833 | A | 8/1990 | Sakamoto et al. |
| 5,060,366 | A | 10/1991 | Asai et al. |
| 5,235,739 | A | 8/1993 | Pedall |
| 5,274,908 | A | 1/1994 | Suzuki et al. |
| 5,331,731 | A | 7/1994 | Suzuki et al. |
| 5,344,202 | A | 9/1994 | Ramler et al. |
| 5,457,874 | A | 10/1995 | Yonezawa et al. |
| 5,495,661 | A | 3/1996 | Gromer et al. |
| 5,500,997 | A | 3/1996 | Kobayashi |
| 5,588,195 | A | 12/1996 | Asai et al. |
| 5,884,746 | A | 3/1999 | Leisner et al. |
| 6,155,555 | A | 12/2000 | Maass |
| 6,397,456 | B1 | 6/2002 | Roos |
| 6,446,560 | B1 | 9/2002 | Slocum |
| 6,640,836 | B1 | 11/2003 | Haubert et al. |
| 6,688,451 | B2 | 2/2004 | Derby et al. |
| 6,725,532 | B1 | 4/2004 | Okada et al. |
| 6,979,032 | B2 | 5/2004 | Damhuis |
| 6,895,661 | B1 | 5/2005 | Gamel et al. |
| 7,222,414 | B2 | 5/2007 | Gamel et al. |
| 8,079,494 | B2 | 4/2008 | Ubidia et al. |
| 7,669,318 | B2 | 3/2010 | Munn |
| 8,020,283 | B2 | 7/2010 | Munn |
| 8,459,109 | B2 | 6/2013 | Caminada et al. |
| 9,814,170 | B2 | 11/2017 | Gieskes et al. |
| 2001/0046929 | A1 | 11/2001 | Derby |
| 2002/0031279 | A1* | 3/2002 | Shimizu ............ H05K 13/0413 382/291 |
| 2002/0064482 | A1 | 5/2002 | Tisone et al. |
| 2002/0077725 | A1 | 6/2002 | Bancroft et al. |
| 2002/0185359 | A1 | 12/2002 | Livingston |
| 2003/0135991 | A1 | 7/2003 | Nagao et al. |
| 2004/0074085 | A1 | 4/2004 | Gieskes |
| 2007/0013328 | A1 | 1/2007 | Shemm |
| 2008/0250636 | A1 | 10/2008 | Osamu et al. |
| 2009/0225304 | A1 | 9/2009 | Hiyoshi |
| 2010/0047285 | A1 | 2/2010 | Liu |
| 2010/0266193 | A1* | 10/2010 | Park .................. H05K 13/0413 382/141 |
| 2010/0276255 | A1 | 11/2010 | Staunton et al. |
| 2011/0125307 | A1 | 5/2011 | Dickson et al. |
| 2011/0280693 | A1 | 11/2011 | Hofmeister et al. |
| 2012/0029688 | A1 | 2/2012 | Lager et al. |
| 2012/0089251 | A1 | 4/2012 | Coady |
| 2012/0152358 | A1 | 6/2012 | Gieskes |
| 2013/0084157 | A1 | 4/2013 | Staunton |

FOREIGN PATENT DOCUMENTS

| | | |
|---|---|---|
| CN | 101185783 A | 5/2008 |
| CN | 104411608 | 3/2015 |
| CN | 201380034088.2 | 9/2016 |
| CN | 106217038 | 12/2016 |
| CN | 106239144 | 12/2016 |
| CN | 106271607 | 1/2017 |
| CN | 106392622 | 2/2017 |
| DE | 112013003227 | 3/2015 |
| DE | 112015000672 T5 | 10/2016 |
| JP | S58-125894 | 7/1983 |
| JP | H05337867 | 12/1993 |
| JP | 08310787 A | 11/1996 |
| JP | 2000254480 | 9/2000 |
| JP | 2009188052 | 9/2000 |
| JP | 2001185898 A | 7/2001 |
| JP | 2002026577 | 1/2002 |
| JP | 2005191465 | 12/2003 |
| JP | 2012099656 A | 12/2003 |
| JP | 2005005415 A | 1/2005 |
| JP | 3778729 B2 | 5/2006 |
| JP | 2009111009 | 5/2009 |
| SE | 538831 C2 | 12/2016 |
| WO | 02/47454 A1 | 6/2002 |
| WO | 2014004838 A2 | 1/2014 |
| WO | 2015/120376 | 8/2015 |

OTHER PUBLICATIONS

Office Action for U.S. Appl. No. 14/568,669, filed Dec. 12, 2014, dated Jun. 30, 2016.

Patent Certificate for CN Application No. 201380034088.2, granted on Sep. 21, 2016.

Notice of Allowance for Swedish application No. 1550063-0, dated Aug. 24, 2016.

Restriction Requirement for U.S. Appl. No. 14/568,713, filed Dec. 12, 2014, dated Mar. 25, 2016.

Office Action for U.S. Appl. No. 14/568,713, filed Dec. 12, 2014, dated Mar. 11, 2016.

Restriction Requirement for U.S. Appl. No. 14/569,003, filed Dec. 12, 2014, dated Mar. 11, 2016.

Office Action for U.S. Appl. No. 14/569,003, filed Dec. 12, 2014, dated Mar. 28, 2016.

International Search Report and Written Opinion (dated May 1, 2015) for International Application No. PCT/US15/14996—Filing Date Feb. 9, 2015.

Chinese Office Action for Application No. 201380034088.2, dated Nov. 23, 2015.

International Search Report and Written Opinion (dated Feb. 10, 2014) for International Application No. PCT/US13/48196—Filing Date Jun. 27, 2013.

Restriction Requirement for U.S. Appl. No. 14/617,298, filed Feb. 9, 2015, dated Apr. 10, 2017.

English translation of Chinese Office Action for Application No. 2015-520506, dated Mar. 22, 2017.

Final Office Action for U.S. Appl. No. 14/569,003, filed Dec. 12, 2014, dated Dec. 30, 2016.

Final Office Action for U.S. Appl. No. 14/568,713, filed Dec. 12, 2014, dated Dec. 30, 2016.

Restriction Requirement for U.S. Appl. No. 14/407,621, filed Dec. 12, 2014, dated Jan. 12, 2017.

Notice of Allowance for U.S. Appl. No. 14/568,669, filed Dec. 12, 2014, dated Dec. 26, 2017.

Final Office Action for U.S. Appl. No. 14/568,669, filed Dec. 12, 2014, dated Jul. 14, 2017.

Office Action for U.S. Appl. No. 14/569,003, filed Dec. 12, 2014, dated Jul. 27, 2017.

Office Action for U.S. Appl. No. 14/617,298, filed Feb. 9, 2015, dated Jun. 30, 2017.

(56) References Cited

OTHER PUBLICATIONS

Office Action for U.S. Appl. No. 14/407,621, filed Dec. 12, 2014, dated Jun. 16, 2017.
Notice of Allowance for U.S. Appl. No. 14/568,713, filed Dec. 12, 2014, dated Jul. 28, 2017.

* cited by examiner

FLEXIBLE ASSEMBLY MACHINE, SYSTEM AND METHOD

RELATED MATTERS

This Application claims priority to U.S. Nonprovisional patent application Ser. No. 14/407,621, filed Dec. 12, 2014, Entitled "Flexible Assembly Machine, System and Method," which claims priority to International Application No. PCT/US13/48196, filed Jun. 27, 2013, entitled "Flexible Assembly Machine, System and Method," which claims priority to U.S. Provisional Patent Application No. 61/665,488, filed Jun. 28, 2012, the disclosures of which are each hereby incorporated by reference to the extent that they are not inconsistent with the present disclosure.

BACKGROUND OF THE DISCLOSURE

1. Technical Field

This invention relates generally to assembly machines, systems and methods. More particularly, the present invention relates to an assembly machine having a continuous track around which one or more dispensing heads rotate, along with systems and methods of use thereof.

2. Related Art

Assembly machines today are typically designed for specific projects or purposes and have specific throughputs, capacities, or the like. If a manufacturer needs a machine that has increased throughput or capacity than their original machine is capable of, the manufacturer typically needs to purchase a completely new machine. This problem is largely present today in pick-and-place machines for assembling circuit boards with components.

A typical pick-and-place machine today includes a feeder system that is located on an outer area of the machine for feeding components to an inner area of the machine where a circuit board is located. One or more pick-and-place heads on the machine are capable of moving in the x, y, and z directions to pick up components from the feeder system and place the components onto the unfinished product or circuit board in the inner area of the machine. The pick-and-place heads may be capable of moving anywhere in the work location between the feeders and where the board is being worked on. They are usually path-optimized to pick up as many components as possible and place them on the board as quickly as possible, returning to the feeders thereafter for more components.

However, assembly machines such as the pick-and-place machine described are not customizable or incrementally expandable depending on the requirements of the unfinished product or circuit board manufacturer, other than adding a second positioning system. Moreover, in the particular pick-and-place machine example, feeder systems need to be optimally placed for each job for optimal assembly speed, which takes a large degree of calculation, operating expertise, and makes change-over of the machine to another product take significantly longer.

Thus, an assembly machine, system and method of use thereof that can be customizable and incrementally expanded that does not require predetermined feeder system positioning would be well received in the art.

BRIEF DESCRIPTION OF THE DISCLOSURE

According to a first aspect, an assembly machine comprises: a plurality of dispensing heads; and a continuous circuitous track around which the plurality of dispensing heads are configured to rotate independently from each other, the plurality of dispensing heads each configured to pick up a component at a first location of the continuous track and place the component at a second location of the continuous track.

According to a second aspect, a method of assembly comprises: providing a continuous circuitous track; providing a plurality of dispensing heads; rotating the plurality of dispensing heads about the continuously circuitous track independently from each other; picking up a component at a first location of the track with a dispensing head of the plurality of dispensing heads; and placing the component at a second location of the track by the dispensing head of the plurality of dispensing heads.

According to a third aspect, an assembly machine comprises: a plurality of track modules, each track module including a section of track, the plurality of track modules connectable to form a continuous circuitous track, the continuous circuitous track configured to receive a dispensing head, the dispensing head configured to rotate about the continuous circuitous track and at least partially assemble an unfinished product; a first feeder module attached to a first length of the continuous circuitous track configured to feed a component to the dispensing head; and a first placement module attached to a second length of the continuous circuitous track configured to receive the unfinished product, wherein the dispensing head is configured to place the component on the unfinished product; wherein the assembly machine is reconfigurable by attaching or removing one or more of the plurality of track modules, the first feeder module and the first placement module.

According to a fourth aspect, a method of assembly comprises: providing a continuous circuitous track mounted across a plurality of track modules; receiving, by the continuous circuitous track, a dispensing head; mounting a first feeder module to a first length of the continuous circuitous track; mounting a first placement module to a second length of the continuous circuitous track; rotating the dispensing head about the continuous circuitous track; at least partially assembling an unfinished product with the dispensing head; and reconfiguring the assembly machine by at least one of: attaching one or more of the plurality of track modules, the first feeder module and the first placement module; and removing one or more of the plurality of track modules, the first feeder module and the first placement module.

According to a fifth aspect, a pick-and-place machine for picking up and placing a component onto a printed circuit board comprises: a continuous circuitous track configured to receive a pick-and-place head, the pick-and-place head configured to rotate around the continuous circuitous track; a feeder module attached to a first length of the continuous circuitous track, the pick-and-place head configured to pick up a component from the feeder module; and a placement module attached to a second length of the continuous circuitous track configured to receive a circuit board for placement, the pick-and-place head configured to place the component onto the unfinished product or circuit board.

According to a sixth aspect, a pick-and-place method comprises: providing a continuous circuitous track; attaching a pick-and-place head to the continuous circuitous track; rotating the pick-and-place head around the continuously circuitous track; attaching a feeder module to a first length of the continuous circuitous track; attaching a placement module to a second length of the continuous circuitous track; feeding a component from the feeder module to the pickand-place head; and placing the component on a circuit board located at the first placement module.

According to a seventh aspect, a pick-and-place head comprises: an attachment mechanism for attaching the pick-and-place head to a continuous circuitous track such that the pick-and-place head is movable along the continuous circuitous track; and a position sensing system for sensing the position of the pick-and-place head with respect to the continuous circuitous track in two or more dimensions.

According to an eighth aspect, a method comprises: providing a pick-and-place head; attaching the pick-and-place head to a continuous circuitous track such that the pick-and-place head is movable along the continuous circuitous track; sensing, by the pick-and-place head, the position of the pick-and-place head with respect to the continuous circuitous track in two or more dimensions; picking up, by the pick-and-place head on the track, a component; and placing, by the pick-and-place head on the track, the component on an electronic assembly.

According to a ninth aspect, an assembly machine comprises: a track; a dispensing head configured to at least partially assemble an unfinished product; and a permanent magnet linear motor system located within the dispensing head and the track, wherein the permanent magnet linear motor system is configured to provide attachment of the dispensing head to the track and configured to provide motion of the dispensing head along the track.

According to a tenth aspect, an assembly method comprises: providing a dispensing head; providing a track; providing a permanent magnet linear motor system located within the dispensing head and the track; magnetically attaching the dispensing head to the track; magnetically moving the dispensing head along the track; and at least partially assembling, with the dispensing head, an unfinished product.

According to an eleventh aspect, a dispensing head comprises: a control system located in the dispensing head; an encoder read head located in the dispensing head; and a light-capture sensor located in the dispensing head configured to detect a light flash of a stationary camera when it illuminates a component on the dispensing head or an element of the dispensing head; wherein the control system is configured to determine a precise encoder position with the encoder read head at a moment of the light flash; wherein the dispensing head is configured to at least partially assemble an unfinished product.

According to a twelfth aspect, a method comprises: providing a dispensing head; providing a control system located in the dispensing head; providing an encoder read head located in the dispensing head; providing a light-capture sensor located in the dispensing head; providing a stationary camera; flashing a light by the stationary camera at a component on the dispensing head or an element of the dispensing head; determining, by the control system and the encoder read head, a precise encoder position at the moment of the flash of light; and at least partially assembling, by the dispensing head, an unfinished product.

According to a thirteenth aspect, an assembly machine comprises: a continuous circuitous track around which a dispensing head is configured to rotate, the dispensing head configured to at least partially assemble an unfinished product; and an air distribution system located within the track configured to distribute air to the dispensing head.

According to a fourteenth aspect, an assembly method comprises: providing a continuous circuitous track; providing a dispensing head attached to the continuous circuitous track; rotating the dispensing head around the continuous circuitous track; distributing air by the continuous circuitous track to the dispensing head; providing the dispensing heads with compressed air; and at least partially assembling, with the dispensing head, an unfinished product.

According to a fifteenth aspect, an assembly machine comprises: a plurality of dispensing heads; a continuous circuitous track around which the plurality of dispensing heads are configured to rotate independently from each other, the plurality of dispensing heads each configured to at least partially assemble an unfinished product; a control system; and a bus communication system configured to provide separate communication between the control system and each of the plurality of dispensing heads, wherein each of the plurality of dispensing heads is not connected to the control system with a separate wire.

According to a sixteenth aspect, an assembly method comprises: providing a continuous circuitous track; providing a plurality of dispensing heads; providing a control system; providing a bus communication system; rotating the plurality of dispensing heads about the continuously circuitous track independently from each other; at least partially assembling, with the plurality of dispensing heads, an unfinished product; and separately communicating via the bus communication system, between the control system and each of the plurality of dispensing heads, wherein each of the plurality of dispensing heads is not connected to the control system with a separate wire.

BRIEF DESCRIPTION OF THE DRAWINGS

Some embodiments of this invention will be described in detail, with reference to the following figures, wherein like designations denote like members, wherein.

DETAILED DESCRIPTION OF THE INVENTION

A detailed description of the hereinafter described embodiments of the disclosed apparatus and method are presented herein by way of exemplification and not limitation with reference to the Figures.

Figure 1:
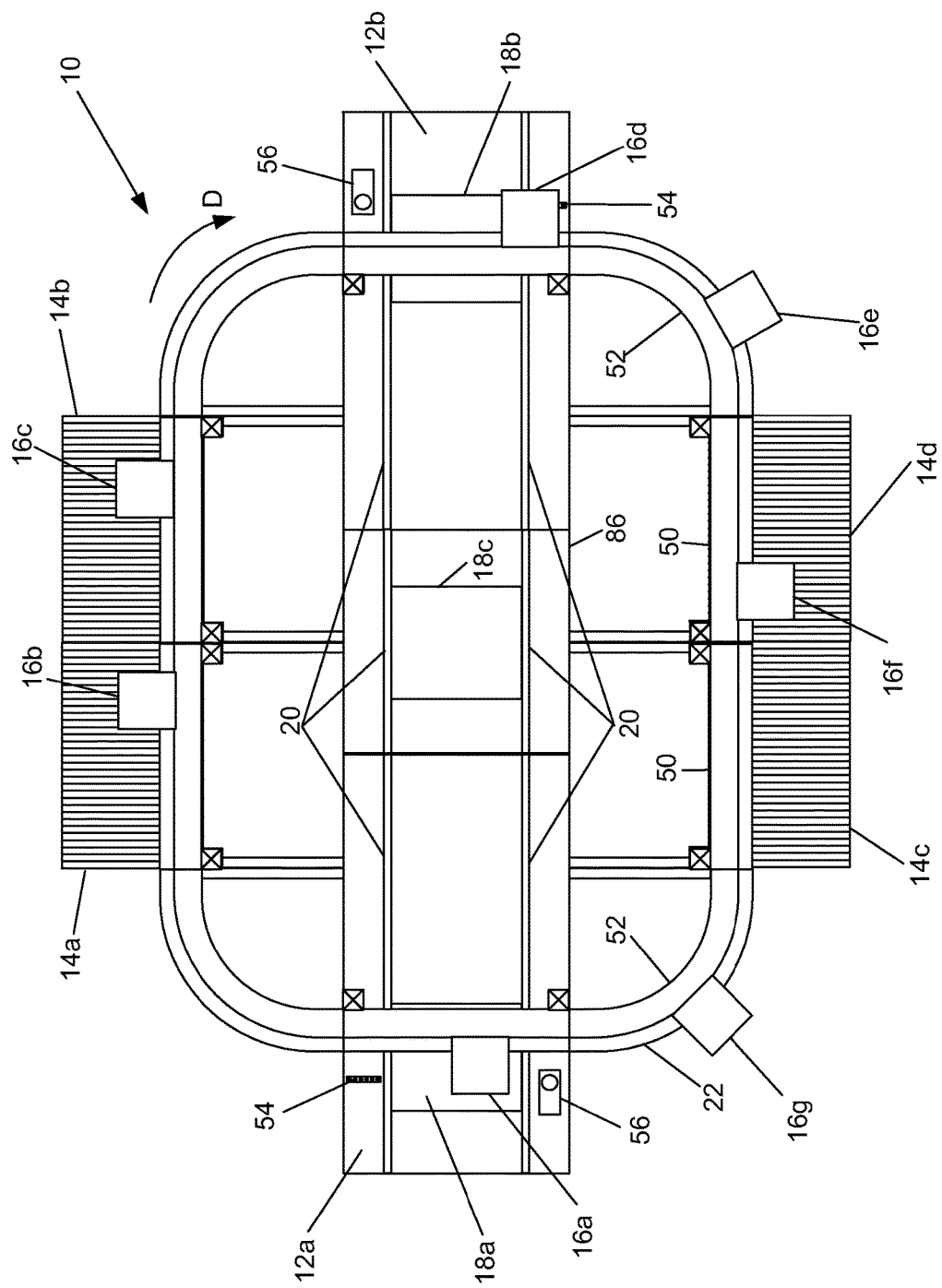
FIG. 1 depicts a top schematic view of an assembly machine according to one embodiment.

Referring to FIG. 1, a schematic view of an assembly machine 10 is shown according to one embodiment. The assembly machine 10 shown in the Figures may be a pick-and-place machine configured to assemble a circuit board. However, the disclosure may be applicable to other types of assembly machines such as toy assembly, tool assembly, appliance assembly, welding, adhesive applying, or the like. The assembly machine 10 may be configured to assemble any device, apparatus or unfinished product that needs component parts to be placed at predetermined locations or other finishing work applied. Herein "unfinished product" may refer to products which are unfinished at the time that they enter the assembly machine 10 or any assembly machine 100, 200, 300, 400, 500 described herein below. However, it should be understood that "unfinished products" may become finished by the assembly machines 10, 100, 200, 300, 400, 500. Alternately, the "unfinished product" may never become fully finished by the assembly machines 10, 100, 200, 300, 400, 500, as they may require further assembly steps (not shown).

The assembly machine 10 includes two placement modules 12a, 12b, four feeder modules 14a, 14b, 14c, 14d, and seven dispensing heads 16a, 16b, 16c, 16d, 16e, 16f, 16g. The dispensing heads 16a, 16b, 16c, 16d, 16e, 16f, 16g may be pick-and-place heads for picking up and placing component parts on a circuit board 18a, 18b. The dispensing heads 16a, 16b, 16c, 16d, 16e, 16f, 16g may also have other functions such as inspection, dispensing of adhesive, or welding tools. Alternately, the dispensing heads 16a, 16b, 16c, 16d, 16e, 16f, 16g may be configured to pick up any other types of components for tools, toys, appliances or the like. Likewise, the feeder modules 14a, 14b, 14c, 14d may be modules that feed circuit board components. Each feeder module 14a, 14b, 14c, 14d may include a plurality of feeders aligned adjacent to each other. Many other types of feeder modules are contemplated however, for feeding various other types of component parts to dispensing heads. The feeder modules 14a, 14b, 14c, 14d may also provide adhesive, or welding materials to the dispensing heads 16a, 16b, 16c, 16d, 16e, 16f, 16g. The placement module 12a, 12b, may accept circuit boards 18a, 18b or any other unfinished products for assembly.

The assembly machine 10 includes a track 22 that comprises a continuous loop, circuit, ring, circle or the like. The track 22 may be continuous and circuitous such that the dispensing heads 16a, 16b, 16c, 16d, 16e, 16f, 16g are configured to rotate about the track 22 in a single direction. For example, all of the dispensing heads 16a, 16b, 16c, 16d, 16e, 16f, 16g may rotate about the track 22 in a clockwise direction. Alternately, the dispensing heads 16a, 16b, 16c, 16d, 16e, 16f, 16g may rotate about the track 22 in a counterclockwise direction. The dispensing heads 16a, 16b, 16c, 16d, 16e, 16f, 16g may be configured to pick up components stored in the feeder modules 14a, 14b, 14c, 14d as they pass by along the track 22. The dispensing heads 16a, 16b, 16c, 16d, 16e, 16f, 16g may thereafter be configured to place the components on an unfinished product or circuit board 18a, 18b that is located in either the first placement module 12a or the second placement module 12b. After placement, the dispensing heads 16a, 16b, 16c, 16d, 16e, 16f, 16g may continue to rotate about the track to pick up more components from the feeder modules 14a, 14b, 14c, 14d and place them on the unfinished product or circuit boards 18a, 18b located in the placement modules 12a, 12b.

In the embodiment shown, the dispensing heads 16a, 16b, 16c, 16d, 16e, 16f, 16g may be configured to rotate about the track 22 in a clockwise direction D. The feeder modules 14a and 14b may be configured to provide component parts to the dispensing heads 16a, 16b, 16c, 16d, 16e, 16f, 16g for placement on the unfinished product or circuit board 18b in the placement module 12b. In other words the feeder modules may store the components for the placement module which immediately proceeds it in the direction of rotation. In this case, the feeder modules 14c and 14d may be configured to provide component parts to the dispensing heads 16a, 16b, 16c, 16d, 16e, 16f, 16g for placement on the unfinished product or circuit board 18a in the placement module 12a. In other words, the feeder modules 14c and 14d in front of the placement module 12a on the track may contain all or most of the high-runner parts for the assembly on the unfinished product or circuit board 18a. However, infrequent components could potentially come from the feeder module 14a, 14b that is at another part of the track. Thus, a dispensing head 16a, 16b, 16c, 16d, 16e, 16f, 16g may pick up a component in the feeder module 14a, 14b, and skip over the first placement module 12b and be instead programmed to place the picked component in the unfinished product or circuit board 18a located in the later placement module 12a. In one embodiment, each dispensing head 16a, 16b, 16c, 16d, 16e, 16f, 16g may be configured to pick up a single component each revolution about the track 22. In other embodiments, the dispensing heads 16a, 16b, 16c, 16d, 16e, 16f, 16g may be configured to pick up two or more components per revolution.

The dispensing heads 16a, 16b, 16c, 16d, 16e, 16f, 16g may be configured to rotate about the track 22 at high rates of speed. For example, in one embodiment, the dispensing heads 16a, 16b, 16c, 16d, 16e, 16f, 16g may move at a velocity of 5 m/s about the track. In other embodiments, the speed of the dispensing heads 16a, 16b, 16c, 16d, 16e, 16f, 16g may be faster or slower. Moreover, there may be more or less dispensing heads 16a, 16b, 16c, 16d, 16e, 16f, 16g than the embodiment shown. The more of the dispensing heads 16a, 16b, 16c, 16d, 16e, 16f, 16 g per assembly machine 10, the faster the assembly machine 10 may be configured to place components on the unfinished product or circuit board 18a, 18b. Using a high number of dispensing heads 16a, 16b, 16c, 16d, 16e, 16f, 16g to ensure that a dispensing head is always above each unfinished product or circuit board 18a, 18b being assembled may help to maximize the output of the assembly machine 10. It should be understood that adding an additional dispensing head to the system may increase the speed of the assembly machine 10 until there are so many dispensing heads that there is a queue, backlog, line, or the like at the slowest step in the process. In some embodiments, the slowest step may be the placement process when the dispensing head 16a, 16b, 16c, 16d, 16e, 16f, 16g is placing a component on the unfinished product or circuit board 18a, 18b but this is not limiting. Therefore, the cycle time of the slowest step may determine the ultimate maximum speed of the assembly machine 10 that has a maximum number of the dispensing heads 16a, 16b, 16c, 16d, 16e, 16f, 16g. Each additional dispensing head added to the assembly machine 10 may add the same output to the system until a maximum number of dispensing heads is reached and a queue or bottleneck at the slowest step in the revolution occurs.

With the present assembly machine 10, steps can be added without slowing the speed when these steps would significantly reduce the speed of a machine utilizing a traditional pick-and-place system. For example, the present system may allow for an adhesive station to be added after a feeder module. In a traditional single or dual placement head machine, an adhesive step occurring after a pickup step would significantly slow down the machine. In contrast, the systems and machines in the present disclosure, could add such an adhesive step without slowing down the overall system. Further, if speed needs to be increased beyond what a present machine is capable even when a maximum number of dispensing heads are located on the machine, the systems in the present disclosure could add a new placement module to further increase speed and number of placements per second in the system. The present disclosure thus is only limited in speed by the space for additional track components but is otherwise unlimited.

Complete X and Y degrees of freedom for the assembly machine 10 is achievable by movement of the unfinished product or circuit boards 18a, 18b and movement of the dispensing heads 16a, 16b, 16c, 16d, 16e, 16f, 16g. For example, the unfinished product or circuit board 18a, 18b may be configured to move in the Y direction (from left to right or right to left in the embodiment shown) along a board handling track 20 of the placement modules 12a, 12b. The dispensing heads 16a, 16b, 16c, 16d, 16e, 16f, 16g are configured to move in the X direction (from up to down or down to up in the embodiment shown). This ensures access to the complete area of the unfinished product or circuit board 18a, 18b in the placement area by the heads 16a, 16b, 16c, 16d, 16e, 16f, 16g. In one embodiment, the unfinished product or circuit boards 18a, 18b need to only move in one direction (for example, from left to right) without having to backtrack during placement. In other embodiments, the unfinished product or circuit boards 18a, 18b may be configured to move backwards during placement to enhance the optimization of placement.

As an example, a placement process of the unfinished product or circuit board 18a may begin by placing or receiving the unfinished product or circuit board 18a in the placement module 12a. This may be done by an automated process. For example, the unfinished product or circuit board 18a may come from a previous machine located to the left of the assembly machine 10 for enacting a previous assembly process on the unfinished product or circuit board. The unfinished product or circuit board 18a may be robotically placed in the placement module 12a from a supply site. Alternately, the unfinished product or circuit board 18a may be manually placed into the placement module 12a. The dispensing heads 16a, 16b, 16c, 16d, 16e, 16f, 16g of the assembly machine 10 may be configured to pick up components from the feeder modules 14a, 14b, 14c, 14d and place them on the leading side (or right side in FIG. 1) of the unfinished product or circuit board 18a. As the leading side of the unfinished product or circuit board 18a becomes populated, it moves to the right along a product track 20. As the unfinished product or circuit board 18a moves to the right the dispensing heads 16a, 16b, 16c, 16d, 16e, 16f, 16g, which move across the unfinished product or circuit board 18a from bottom to top, may obtain access to the full surface of the unfinished product or circuit board 18a. In this embodiment, the unfinished product or circuit board 18a may move only in the rightward direction during the population in the placement module 12a. Alternately, the unfinished product or circuit board 18a may move to the right and left during placement in order to better optimize the process.

The first and second placement modules 12a, 12b may include their own product track 22 for transporting the unfinished product or circuit board 18. In one embodiment, the component population placed at the first placement module 12a may be only a portion or less than the full population to be placed on the entire circuit board 18a. A board handling system 86 may be located between the placement module 12a and the placement module 12b. The board handling system 86 may include its own product track 20. The unfinished product or circuit board 18a may move to the second placement module 12b along the product track 20 of board handling system 86. for the second half of the components to be placed thereon. The assembly machine 10 may be configured to automate the movement process of the unfinished product or circuit board 18a throughout the entire process. Similar to the first placement module 12a, the unfinished product or circuit board may move from left to right across the second placement module 12b or may move in both directions.

Figure 3:
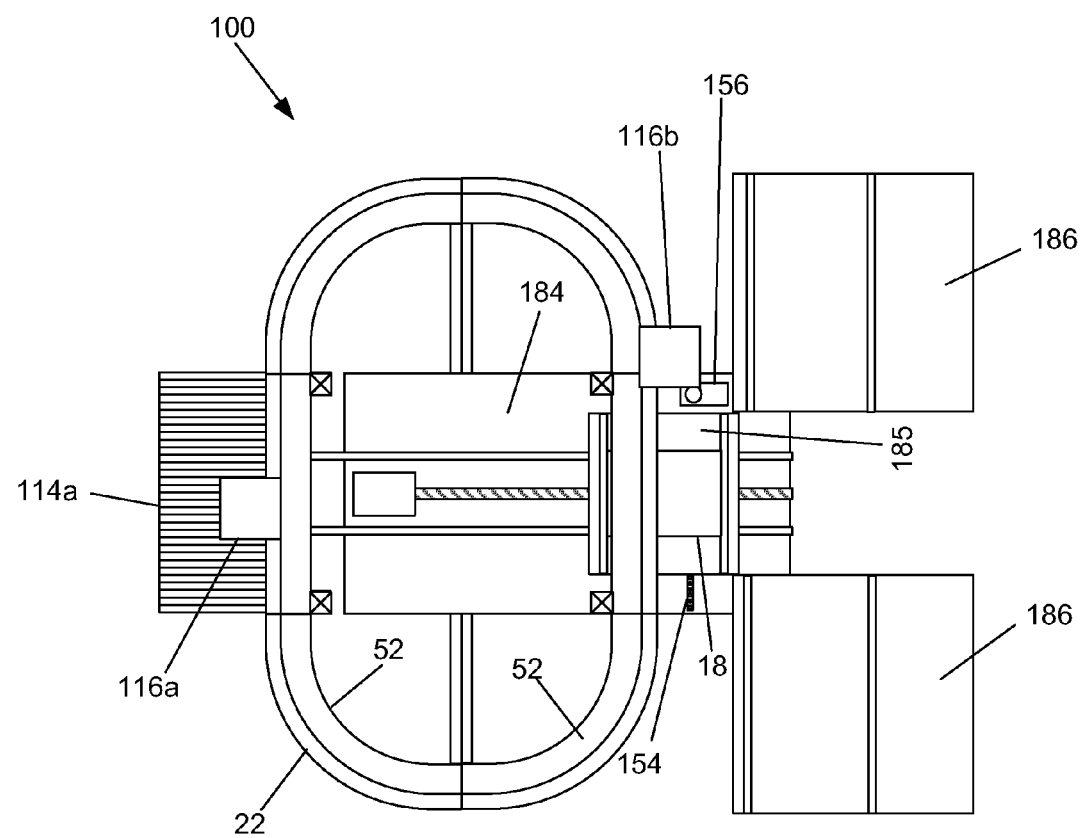
FIG. 3 depicts a top schematic view of another assembly machine according to one embodiment.

In other embodiments (as shown in FIG. 3, for example, and described herein below), a single placement module, such as the placement module 12a or 12b, may provide for full or complete population of each circuit board or other product. In these embodiments, the unfinished product or circuit board or other product may be fed by the placement module in a first direction during placement. For example, the circuit board or other unfinished product may move from left to right in the placement module while the dispensing heads populate the circuit board or other unfinished product. The circuit board or other unfinished product may then be expelled from the placement module in the opposite direction (right to left). Thus, the circuit board or other unfinished product may be expelled from the exact same location from which it was fed. In this case, the placement module 12a, 12b may include a load and an unload system, rather than having a load system in the 12a module and an unload system in the 12b module. In this embodiment, the board handling system 86 may not be necessary to move the unfinished product or circuit board or other product across the assembly machine 10.

Figure 2:
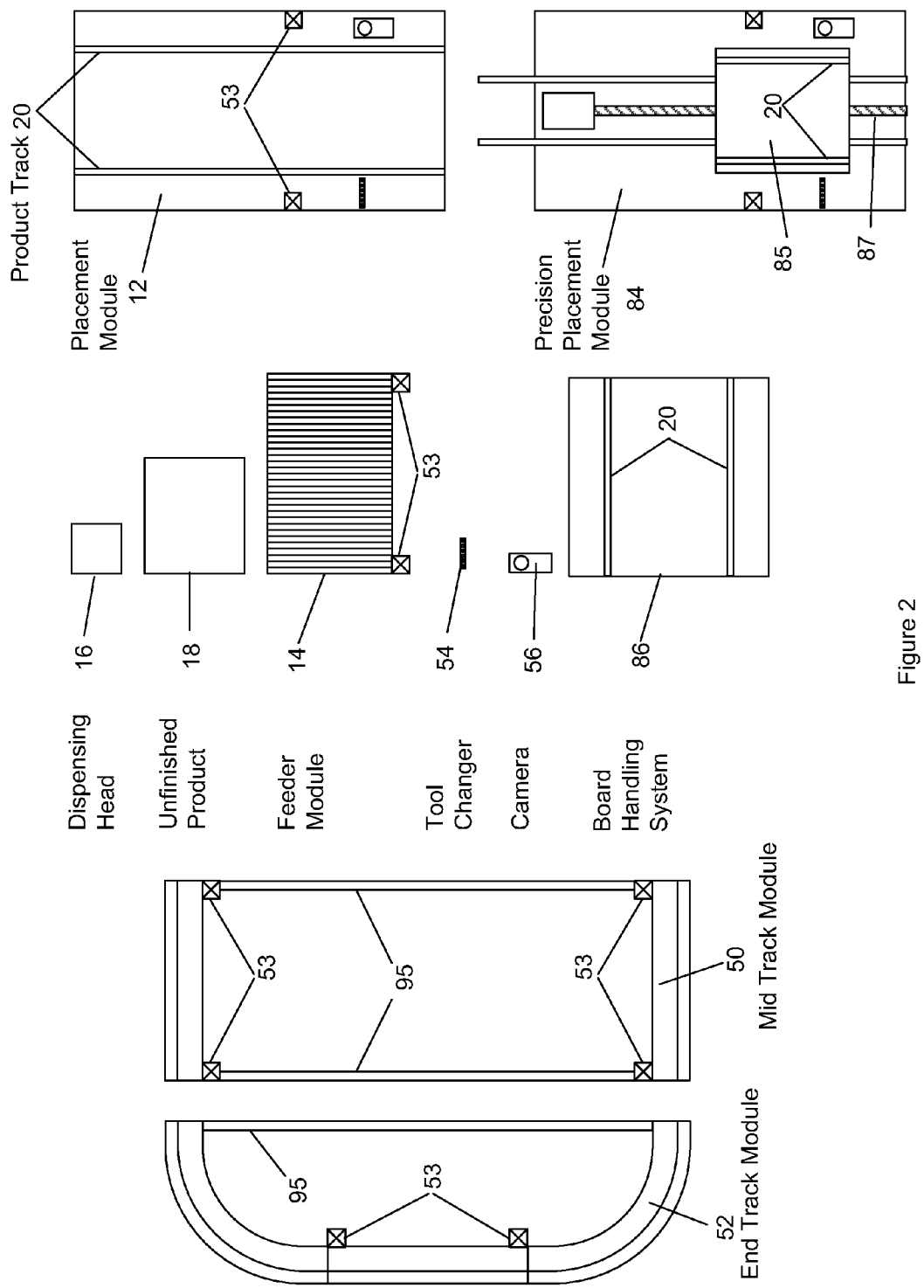
FIG. 2 depicts an exploded view of components and modules of the assembly machine of FIG. 1 according to one embodiment.

The systems described in the present invention are completely flexible and customizable or extendable in nature as will be described herein. FIG. 2 shows an exploded view of various components of an assembly machine such as the assembly machine 10. These components can be added or subtracted from a system or utilized to create a customized system for any amount of output needed. Shown in FIG. 2 is an end track module 52, a mid track module 50, a head 16, a circuit board 18, a feeder module 14, a tool or nozzle changer 54, a camera 56, a product track 20, and a placement module 12. These components may each be the same as the respective components in the assembly machine 10 or later assembly machines 100, 200, 300, 400 described hereinafter. The end track module 52 and the mid track module 50 may each include a frame 95. The frame 95 may be configured to hold the track modules 52, 50 and may be configured to connect with adjacent frames of adjacent track modules.

The end track module 52 may include a frame and a U-shaped track. The end track module 52 may contain one mounting interface 53 on the straight part of the track where a placement module 12 or a feeder module 14 may be mounted. Cameras and other stationary processing stations may also be mounted on the end track module 52. Likewise, the mid track module 50 may provide a straight connection of the tracks on both sides of the module 50. The module may have two separate straight tracks: one on each side of the module 50. Each of these tracks may contain one mounting interface 53 for a placement module 12 or a feeder module 14. Like the end track module 52, cameras or other stationary processing stations may be mounted on the mid track module 50.

The placement module 12 may provide an interface that allows it to be mounted to a straight part of the track of an end module, or either side of a middle module. In the case that the machine is configured for the pick-and-placement of components on a circuit board, this module may contain a circuit board transport belt system, a circuit board clamp system, and a circuit board support system. Each of these systems may be mounted on a high accuracy servo axis. A circuit board may be configured to enter this module from another circuit board transport module, or from a circuit board magazine loader or unloader. A circuit board may be moved to the clamping position by the unfinished product or circuit board belt. Then the unfinished product or circuit board may be clamped and held in a fixed position on the belt. Following this, a circuit board support system may be activated, containing pins for example, to provide support to the unfinished product or circuit board. The placement module 12 may further include a width adjustment mechanism. The entire transport including the belts, drives, support system and a width adjustment mechanism may be mounted on a linear bearing and a high accuracy linear drive. The linear drive may be configured to move the unfinished product or circuit board into such positions that cameras on the placement heads 16 may image marks on the unfinished product or circuit board to ascertain the exact position of the unfinished product or circuit board with respect to the track 22. Upon completion of component placement at the placement module 12, the unfinished product or circuit board can be released from the unfinished product or circuit board support, unclamped and the unfinished product or circuit board transport belt may transport the unfinished product or circuit board to another transport belt or into a magazine loader/unloader. Alternately, the unfinished product or circuit board may be inserted by hand. Cameras and other stationary processing stations may be mounted on modules 12.

Referring still to FIG. 2, a high precision placement module 84 is shown with a high accuracy circuit board handling transport system 85. This transport system 85 may include the product track 20, a circuit board clamp system and circuit board support system which can be mounted on a high accuracy Y-drive system 87 in all four orientations: fixed rail left, back, right and front. This allows for a pass through mode and single side in-out mode as well as providing for an inline and online mode. To further simplify the different modes of transport of the circuit board of unfinished product through the system, the placement modules 12, 84 may be dimensioned such that two placement modules 12, 84 mounted on each side of a middle track module 50 can be connected in the center of the middle track module 50 and unfinished products or circuit boards 18 may be passed directly from one placement module to the next within the same middle track module 50, as shown later in FIG. 7.

The feeder module 14 may be mounted to the end track module 52 or the mid track module 50 in the same way as the placement module 12. On the feeder module 14, all the required component feeders may be mounted. The feeder interface module may contain controls for feeders to provide the components so that they can be picked up appropriately by the placement heads 16.

Moreover, the mounting interface of the module frames for the feeder modules 14 and the placement modules 12, 84 may be identical for ease of mounting on any track module 50, 52 during manufacturing. The identical nature of the mounting frames may minimize tolerance build-up and allow for the interchangeability of the feeder modules 14 and the placement modules 12, 84 in any system. The feeder modules 14 and placement modules 12, 84 may be built into lengths of the track 22 at the manufacturing stage and sold to customers together. These combined feeder module/track lengths and placement module/track lengths may be provided to purchasers of an assembly machine for immediate addition to existing track or machine, or for immediate construction of a customized track or machine. However, the placement module 12, 84 may further include an attached tool or nozzle changer 54 and camera 56, or other processing stations (i.e. component straightener, flux dispenser, electrical tester, etc.) to facilitate a placement cycle.

Thus, the assembly machine may include a plurality of track modules 50, 52, each module 50, 52 containing a section of the track 22. The plurality of modules 50, 52 may be connectable to form a continuous circuitous track such as the track 22. The continuous circuitous track 22 may be configured to receive a dispensing head 16 which is configured to rotate about the continuous circuitous track 22 and at least partially assemble the unfinished product 18. The feeder modules 14 may be attached to a first length of the continuous circuitous track 22 and may be configured to feed a component to the dispensing head 16. The component may be an electronic component, tool head, weld material, adhesive, or anything provided from the feeder modules 14 to the dispensing head 16. The placement module 12, 84 may be attached to a second length of the continuous circuitous track 22 and may be configured to receive an unfinished product such as the unfinished product or circuit board 18. The dispensing head may be configured to place the component on the unfinished product. The track 22 may thus be reconfigurable by attaching ore removing one or more of the plurality of modules 50, 52 of the track 22. The reconfiguration may be enabled by attaching or removing the one or more modules 50, 52 to accommodate or remove additional placement modules 12, 84 and feeder modules 14. The continuous circuitous track 22 may be reconfigurable without machining or other permanent alteration processes. Moreover, the continuous circuitous track 22 may be reconfigurable with standard hand tools such as screw drivers, wrenches, pliers and the like.

Still further, a method of assembly contemplated by the present disclosure may include providing a continuous circuitous track, such as the track 22, mounted across a plurality of modules, such as the modules 50, 52. The method may include receiving, by the continuous circuitous track, a dispensing head, such as the dispensing head 16. The method may include mounting a first feeder module, such as the feeder module 14, to a first length of the track 22. The method may include mounting a first placement module, such as the placement module 12, to a second length of the track 22. The method may include at least partially assembling an unfinished product, such as the unfinished product or circuit board 18, with the dispensing head. The method may further include reconfiguring the continuous circuitous track by either: A) attaching one or more of the modules of the track; or B) removing one or more of the modules of the track. The method may further include providing an assembly machine and reconfiguring the assembly machine by removing a feeder modules and replacing it with a placement module or removing a placement module and replacing it with a feeder module. The method may further include reconfiguring the assembly machine by adding one or more feeder modules or removing one or more feeder modules. The method may further include reconfiguring the assembly machine by adding one or more placement modules or removing one or more placement modules.

The flexibility, customizablity and extendability of the machines and systems described herein may be displayed with reference to the embodiments shown in FIGS. 3-6. Referring firstly to FIG. 3, another assembly machine 100 is shown. This assembly machine 100 may be an example of the simplest machine that may be created in accordance with the present disclosure. The assembly machine 100 may include two end modules 52 of track. Integrated or attached to one of the end modules 52 is a feeder module 114a. Integrated or attached to the second opposing end module 52 is a placement module 184. The placement module 184 includes the board handling system 85. Two board handling systems 186 may be provided in this Figure. These board handling systems 186 may be mounted to the assembly system 100 and may provide the ability to transport unfinished product or circuit boards 18 to and from assembly machine 100. The system is shown including two dispensing heads 116a, 116b. A first dispensing head 116a is shown picking a component from the feeder module 114a, and a second dispensing head 116b is shown placing a component on the unfinished product or circuit board 18. The machine 100 may therefore be a low cost machine with a limited output compared to larger machines with more modules and dispensing heads. However, the components 112, 114, 116, 52, 22, 156, 154 of the machine 100 are the same components that may be utilized in larger machines with a longer track.

Figure 4:
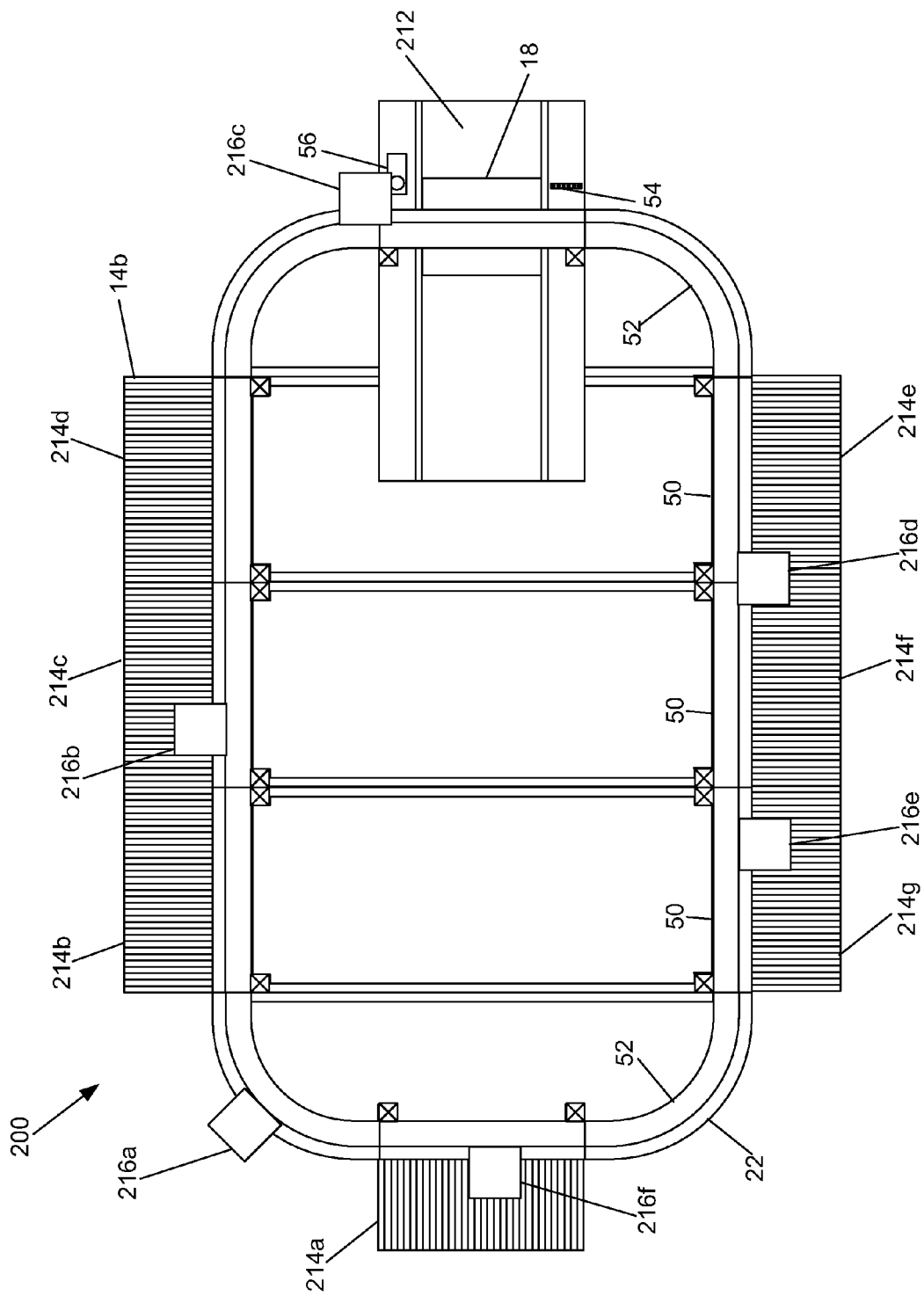
FIG. 4 depicts a top schematic view of another assembly machine according to one embodiment.

Referring now to FIG. 4, another assembly machine 200 is shown. The assembly machine 200 may be an example of a system which requires many different feeder modules. In particular, the assembly machine 200 includes seven feeder modules 214a, 214b, 214c, 214d, 214e, 214f, 214g with a single placement module 212. The assembly machine 200 includes two end track modules 52 and three mid track modules 50. Moreover, the assembly machine 200 includes six dispensing heads 216a, 216b, 216c, 216d, 216e, 216f. In this embodiment, because there is only a single placement module 212, the placement module 212 may be configured for both loading and unloading without the need for a product track 20 or transport system.

It should be understood that the assembly machine 200 may be created by modifying or extending the assembly machine 100 of FIG. 3. For example, the end track modules 52 of the assembly machine 100 may be separated. Thereafter, three mid track modules 50, each having an integrated or attached feeder module 214, may be placed between each of the top and bottom ends of the end track modules 52. Then, once the track 22 is completed, four additional dispensing heads 216 may be added to include six in total.

Figure 5:
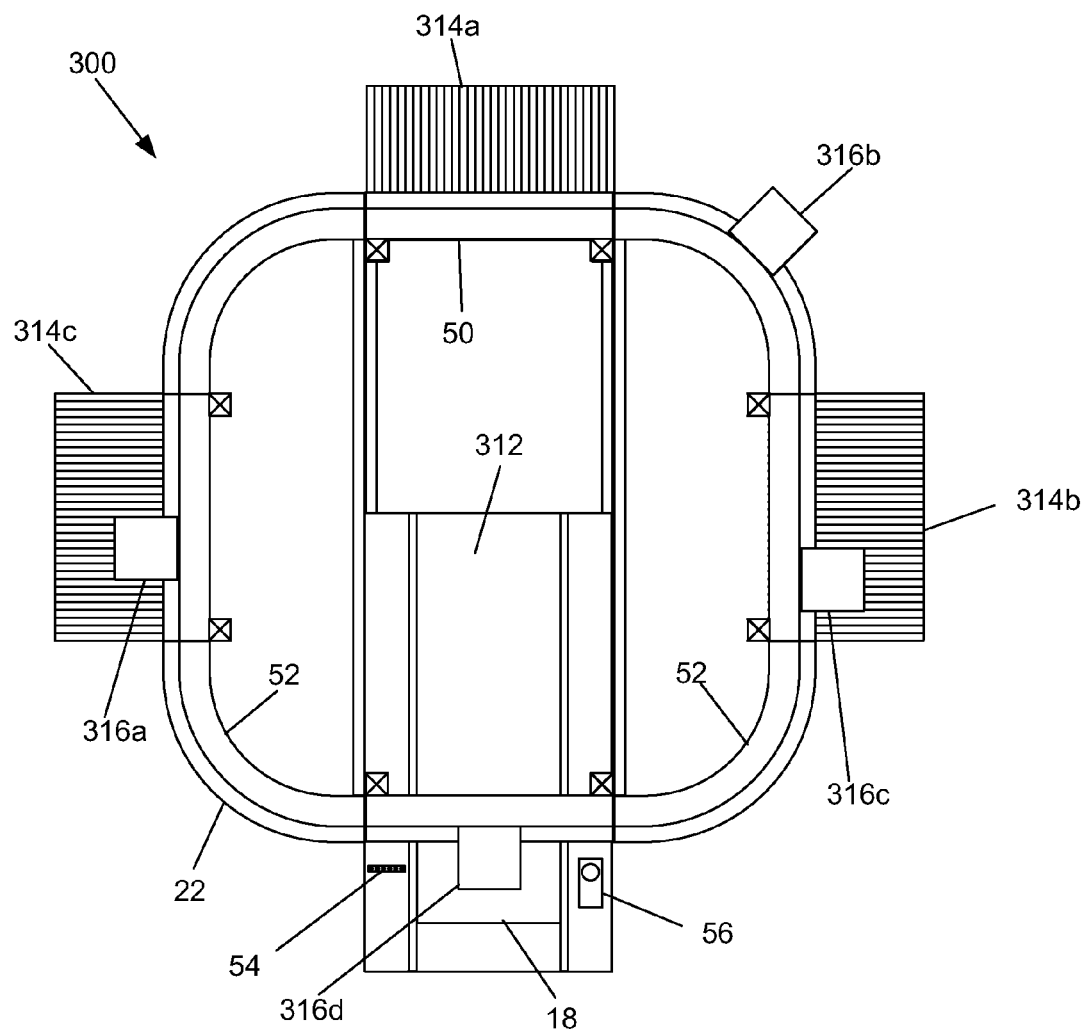
FIG. 5 depicts a top schematic view of another assembly machine according to one embodiment.

FIG. 5 shows another assembly machine 300. The assembly machine 300 may include three feeder modules 314a, 314b, 314c. The assembly machine 300 may include four dispensing heads 316a, 316b, 316c, 316d. The assembly machine 300 may include a single placement module 312. The assembly machine 300 may be created by modifying the assembly machine 200 or the assembly machine 100. For example, to create the assembly machine 300 from the assembly machine 200, one need only remove two mid track modules 50 on each of the top and bottom of the assembly machine 200 with their respective feeder modules 214c, 214d, 214e, 214f. Additionally, two dispensing heads 216a and 216b may be removed, leaving the four shown on the assembly machine 300. Similarly, mid track modules 50 with feeder modules 314 may be added to the assembly machine 100, along with two additional dispensing heads to create the assembly machine 300.

Figure 6:
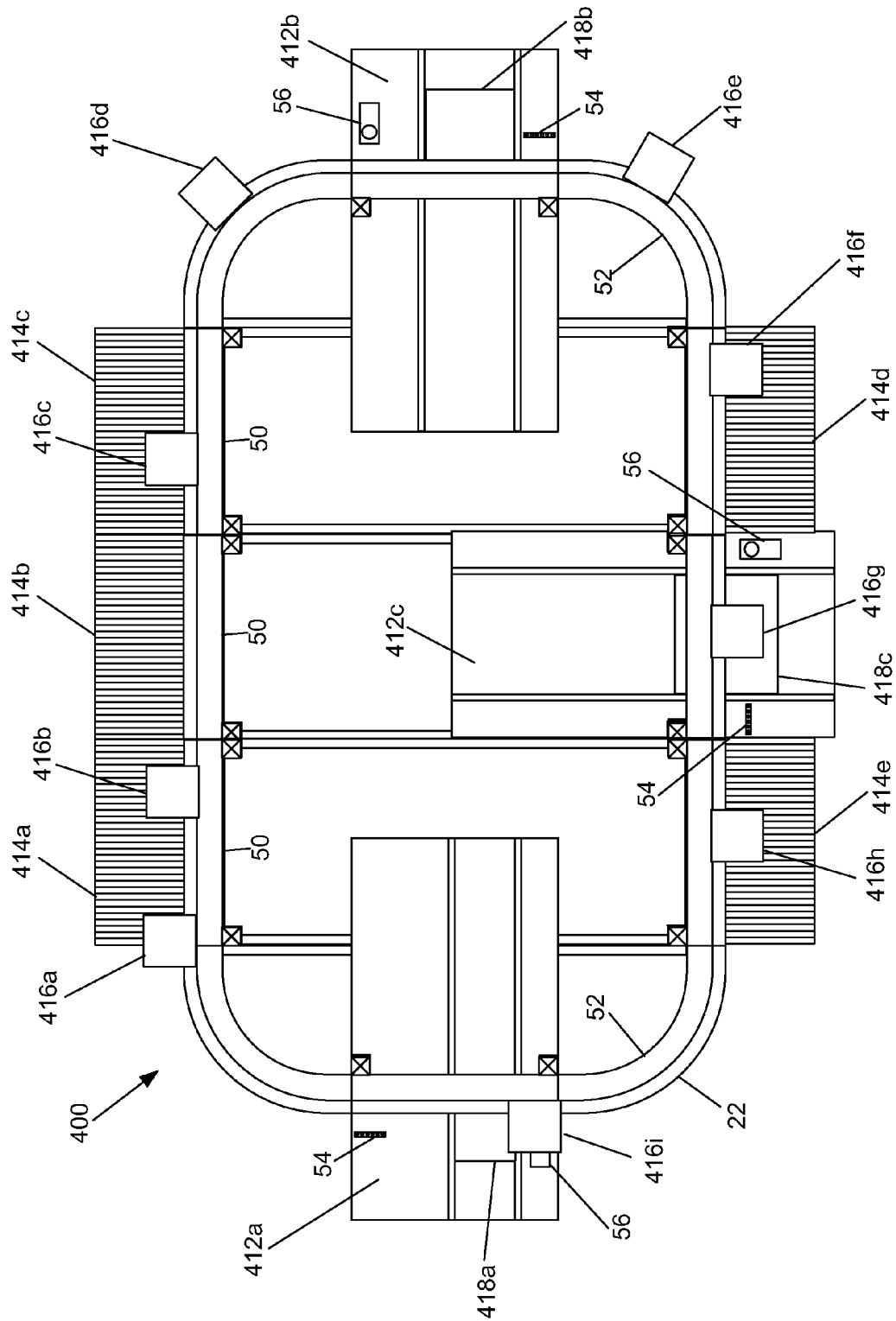
FIG. 6 depicts a top schematic view of another assembly machine according to one embodiment.

Referring now to FIG. 6, another assembly machine 400 is shown. The assembly machine 400 includes five feeder modules 414a, 414b, 414c, 414d, 414e, nine dispensing heads 416a, 416b, 416c, 416d, 416e, 416f, 416g, 416h, 416i, and three placement modules 412a, 412b, 412c. The placement modules 412a, 412b, 412c are shown with different sized unfinished products or circuit boards 418a, 418b, 418c. For example, the placement modules 412a includes the smallest circuit board 418a. The placement modules 412b includes the largest circuit board 418b. The placement modules 412c includes a mid-sized circuit board 418c. Thus, it should be understood that a single assembly machine may accommodate assembly of various different kinds of circuit boards or other products. Each of these placement modules 412a, 412b, 412c may include their own loading and unloading systems, and their own unfinished product or circuit board magazine loader or unloader systems for automatically or manually providing more unfinished products or circuit boards to the placement modules 412a, 412b, 412c.

The assembly machines shown in this disclosure have varying sizes and components. However, it should be understood that the principles of the present disclosure may be utilized to create machines with no limit in size. Any length of track and any number of feeder modules and placement modules and dispensing heads are contemplated. Moreover, the placement modules may both load and unload circuit boards at the same location. Alternately, a first placement module may load a circuit board for an initial placement cycle, and then provide the unfinished product or circuit board to a second placement module for a second placement cycle via a product track 20.

Figure 7:
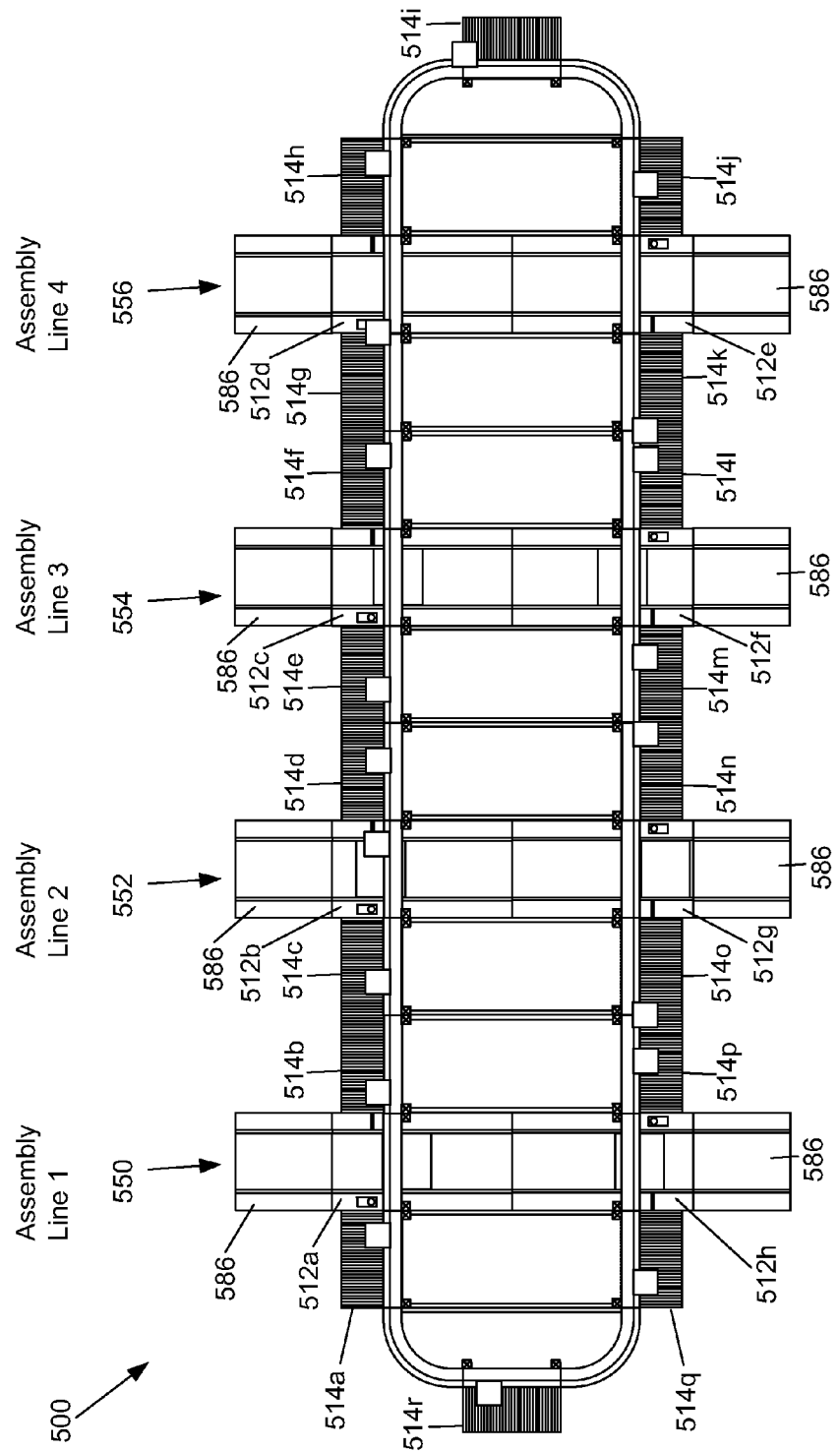
FIG. 7 depicts a top schematic view of another assembly machine according to one embodiment.

Another assembly machine 500 is shown in FIG. 7. This assembly machine 500 may be considered a "factory machine" in that there are four different assembly lines 550, 552, 554, 556 in the machine 500. The assembly machine 500 includes eight placement modules 512a, 512b, 512c, 512d, 512e, 512f, 512g, 512h. The assembly machine 500 includes eighteen feeder modules 514a, 514b, 514c, 514d, 514e, 514f, 514g, 514h, 514i, 514j, 514k, 514l, 514m, 514n, 514o, 514p, 514q, 514r. The assembly machine 500 includes nineteen dispensing heads 516a, 516b, 516c, 516d, 516e, 516f, 516g, 516h, 516i, 516j, 516k, 516l, 516m, 516n, 516o, 516p, 516q, 516r, 516s. The assembly lines 550, 552, 554, 556 may be configured to each assemble a different kind of circuit board or other unfinished product. In this case, the circuit board or other unfinished products may move from the top placement module 512a, 512c, 512e, 512g to the bottom placement module 512b, 512d, 512f, 512h along the product tracks 20. Board handling systems 586 may be attached to each end of the assembly lines and may be attached to the placement modules 512a, 512b, 512c, 512d, 512e, 512f, 512g, 512h to facilitate transport of the unfinished product or circuit boards. This machine displays a system in which the product tracks 20 are located between the ends of a single mid module, rather than across multiple mid modules.

It should be understood that a system or machines 10, 100, 200, 300, 400, 500 provided in accordance with the present disclosure may not be limited in speed by the number of feeder modules 14, 114, 214, 314, 414, 514 that are necessary. In other words, lengthening the amount of track 22 will not slow down the output of the machine 10, 100, 200, 300, 400, 500 if an appropriate number of dispensing heads 16, 116, 216, 316, 416, 516 are added to the system to compensate for the additional length. Moreover, the output of the system or machine 10, 100, 200, 300, 400, 500 may be independent of the location or position of each feeder or feeder module 14, 114, 214, 314, 414, 514. A full cycle of a dispensing head 16, 116, 216, 316, 416, 516 takes the same amount of time, independent of where the dispensing head 16, 116, 216, 316, 416, 516 needs to pick up a component from a feeder. This also means that in the present assembly machine 10, 100, 200, 300, 400, 500, a feeder module 14, 114, 214, 314, 414, 514 does not need to be moved to another position during a changeover. Optimization of the assembly machines 10, 100, 200, 300, 400, 500 described herein can be accomplished by minimizing the movement of the unfinished product or circuit board 18 or other product being provided with the component parts. This optimization provides for a gentle movement of the unfinished product or circuit board 18, 118, 218, 318, 418, 518 or other product while the dispensing heads 16, 116, 216, 316, 416, 516 in the system have high acceleration and deceleration rates, and move at high rates of speed.

Still further, the systems or machines 10, 100, 200, 300, 400, 500 in accordance with the present disclosure may be scalable for speed. Every dispensing head 16, 116, 216, 316, 416, 516 may go through a complete pick-and-place cycle at a predictable time. This time may be determined by a length of the track and the number of stops or slowdowns made by the dispensing heads 16, 116, 216, 316, 416, 516. In a typical cycle, there may be four steps: a pick up stop, a vision/camera stop, slowdown or station, a placement stop, and a nozzle change stop. The length of the track may be determined by the number of feeder modules 14, 114, 214, 314, 414, 514 and/or placement modules 12, 84, 184, 212, 312, 412, 512 per pick-and-place cycle. By adding placement modules 12, 84, 184, 212, 312, 412, 512, the speed of the machines 10, 100, 200, 300, 400, 500 per dispensing head along the same length of track may be increased.

Figure 8:
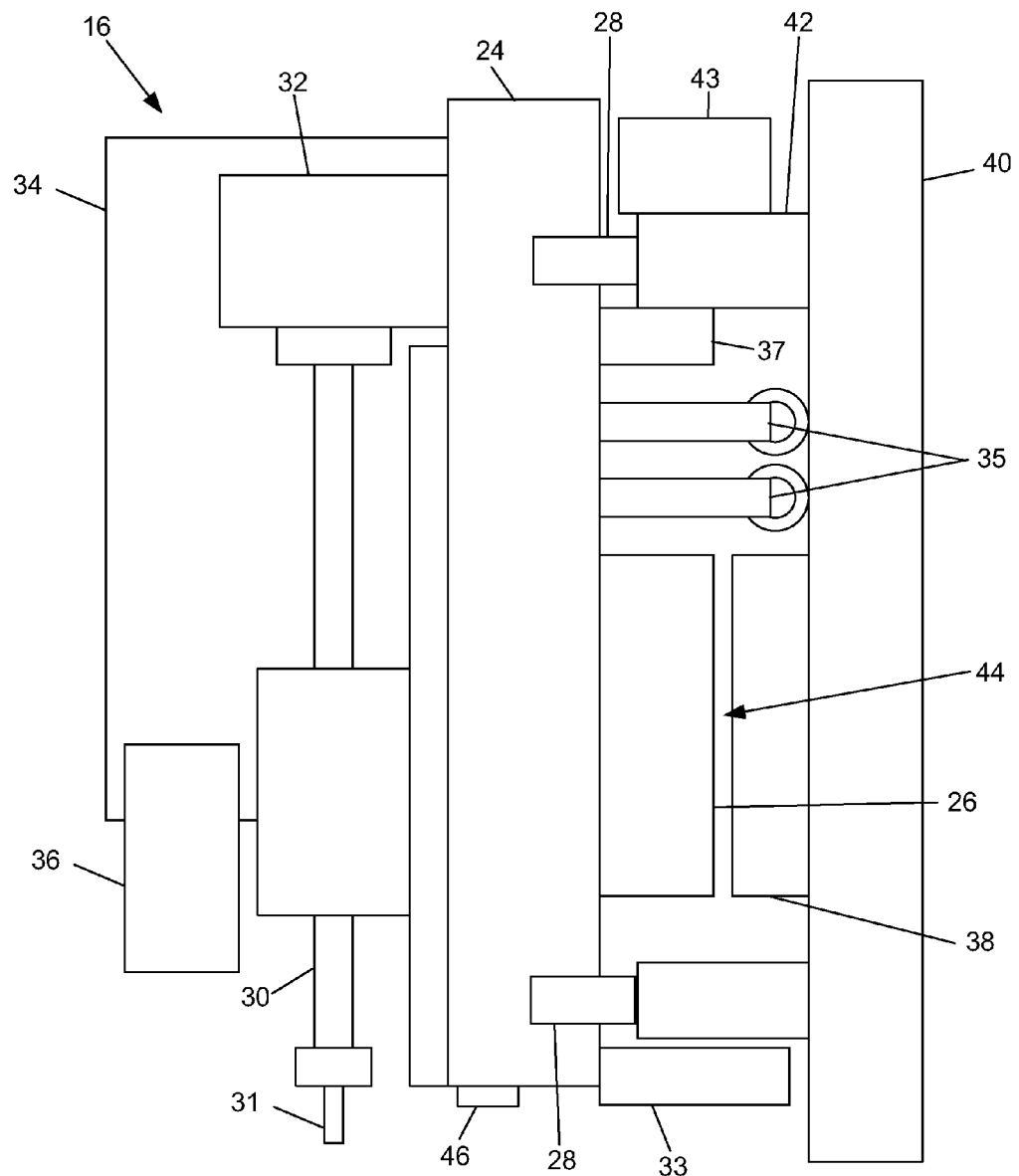
FIG. 8 depicts a side cutaway view of a dispensing head attached to a track of the assembly machine of FIG. 1 according to one embodiment.

Referring now to FIG. 8, a side cutaway view of one of the dispensing heads 16 is shown attached to the track 22. It should be understood that the dispensing head 16 may be the exact same head as any of the dispensing heads 16, 116, 216, 316, 416, 516. In the embodiment shown, it should be understood that the dispensing head 16 may include a base 24, a linear motor coil unit 26, a bearing system 28, a spindle 30, a nozzle 31, a z-axis drive 32, an encoder read head 33, a control and power system 34, a contact rail 35, a tool or nozzle changer 36, and an air seal 37. The track 22 may refer to a magnet rail 38, a frame 40, a bearing rail 42 and an air distribution system 43. Thus, the track 22 may be magnetic and may include a permanent magnetic motor 44 that includes the linear motor coil unit 26 of the dispensing head 16 and the magnet rail 38 of the track 22. The magnet rail 38 may comprise many magnets placed adjacent to each other. The magnetic rail 38, in conjunction with the linear motor coil unit 26 in the dispensing head 16 may be able to move the dispensing head 16 on the track 22. Alternately, the track 22 may comprise a plurality of coils, while the dispensing head 16 may comprise the permanent magnets.

The frame 40 of the track 22 may function to provide support for the track 22 and the dispensing head 16. The frame 40 may be made of metal, cast iron, stainless steel, wood, or any material that is capable of supporting the track 22. The frame 40 may be curved at different points along its length in order to accommodate the circuitous track 22. The curve of the track 22 and frame 40 however, should account for corners or curves that have a large enough radius so that the linear motor 44 is still able to function well enough to provide the required amount of acceleration, deceleration and velocity on the dispensing head 16.

Attached to the frame 40 around the entire length of the track 22 may be the magnet rail 38. The magnet rail 38 may be part of the permanent magnet linear motor 44. The magnet rail 38 of permanent magnetic motor 44 in conjunction with the linear motor coil unit 26 may exact motion of the dispensing head 16 about the track 22. The permanent magnet linear motor system 26, 38, 44 may be programmable to independently drive the plurality of dispensing heads 16 on the track 22. The linear motor coil unit 26 may be an iron core coil unit. In addition, the magnet rail 38, in conjunction with the linear motor coil unit 26, may be an attachment mechanism for attaching the pick-and-place head 16 to the track 22. In other embodiments, the permanent magnet linear motor 44 may be replaced by other drive and attachment mechanism means such as a switch reluctance linear motor. In yet another embodiment, the permanent magnet linear motor 44 may be replaced with driven wheels. In still another embodiment, the dispensing heads 16 may include a moving permanent magnet and the track 22 may instead include a plurality of stationary iron core coils or linear motor coils. In the case that drive wheels instead of magnets were used, additional rails may be necessary to keep the dispensing heads 16 on the track 22. In this case, there may need to be additional rails to keep the dispensing heads 16 from falling off the track 22. In the embodiment where the permanent magnet linear motor 44 is used, the dispensing heads 16 may be attached to the track 22 by the magnetic attraction of the linear motor coil unit 26. In this embodiment, adding a dispensing head to the system may be as simple as snapping the dispensing head into place on the track 22 and then activating it by a control system of the assembly machine 10 or track 22.

An assembly method is also contemplated which may include providing a dispensing head, such as the dispensing head 16. The method may further include providing a track, such as the track 22. The method may include providing a permanent magnet linear motor system, such as the system 26, 38, 44, located within the dispensing head and the track. The method may include magnetically attaching the dispensing head to the track, magnetically moving the dispensing head along the track, and at least partially assembling, with the dispensing head, an unfinished product, such as the unfinished product or circuit board 18. The dispensing head 16 may include a contact rail 35. The contact rail 35 may be configured to contact a part of the frame 40 of the track 22 that carries power, electricity or other electrical signals. Thus, the track 22 may be configured to provide power to the dispensing heads 16 from the contact rail 35. The contact rail 35 is shown consisting of two contact locations in FIG. 8. However, it should be understood that the contact rail 35 may include more than two contacts. For example, the contact rail 35 may include 2-10 contact locations. Moreover, this may allow communications from a control system of the track 22 or the assembly machine 10 to be sent to the dispensing head 16. The contact rail 35 may include contacts 35a, 35b for sending power and communication signals. In other embodiments, communication may be provided from the control system of the track 22 or assembly machine 10 may communicate wirelessly with the dispensing head 16 through Wi-Fi, Zigbee or the like.

The assembly machine 10 may thus include a control system 1000 (shown more particularly herein below in FIG. 11) which may be located within one or more of the placement modules 12, 84, 184, 212, 312, 412, 512 for example. The assembly machine 10 may thus include a bus communication system configured to provide separate communication between control system 1000 and each of the dispensing heads 16. Each of the separate plurality of dispensing heads 16 may not be connected to the control system 1000 with a separate wire. Instead, they may be connected with the bus system which may provide data packets to targeted dispensing heads 16, for example.

In another embodiment, a method is contemplated, which may include providing a continuous circuitous track, such as the track 22. The method may include providing a plurality of dispensing heads, such as the dispensing heads 16. The method may further include providing a control system, such as the control system 1000. The method may further include providing a bus communication system. The method may then include rotating the plurality of dispensing heads about the track independently from each other and at least partially assembling an unfinished product, such as the unfinished product or circuit board 18, with the dispensing heads. The method may include communication separately via the bus communication system between the control system and each of the plurality of dispensing heads. Each of the plurality of dispensing heads may not be connected to the control system with a separate wire.

Figure 9B:
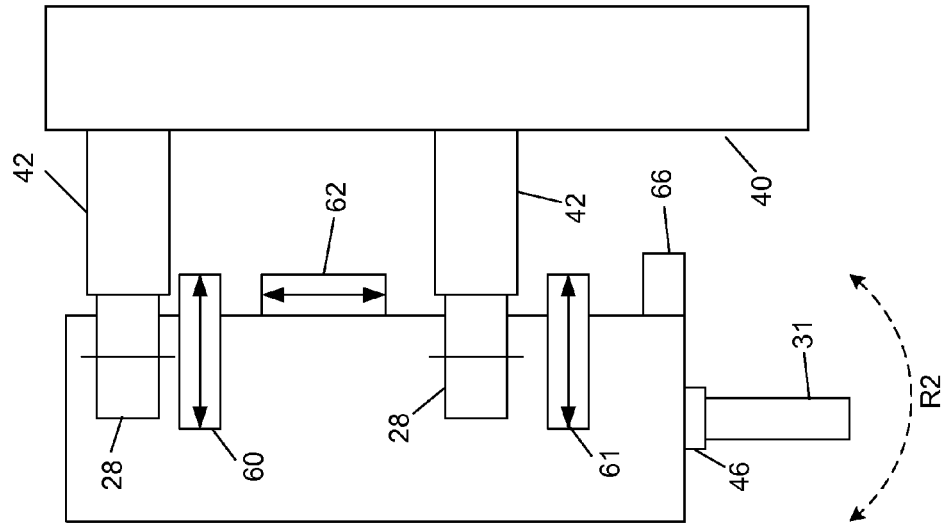
FIG. 9B depicts a side view of the positional measurement system of the dispensing head of FIG. 9A according to one embodiment.
Figure 9A:
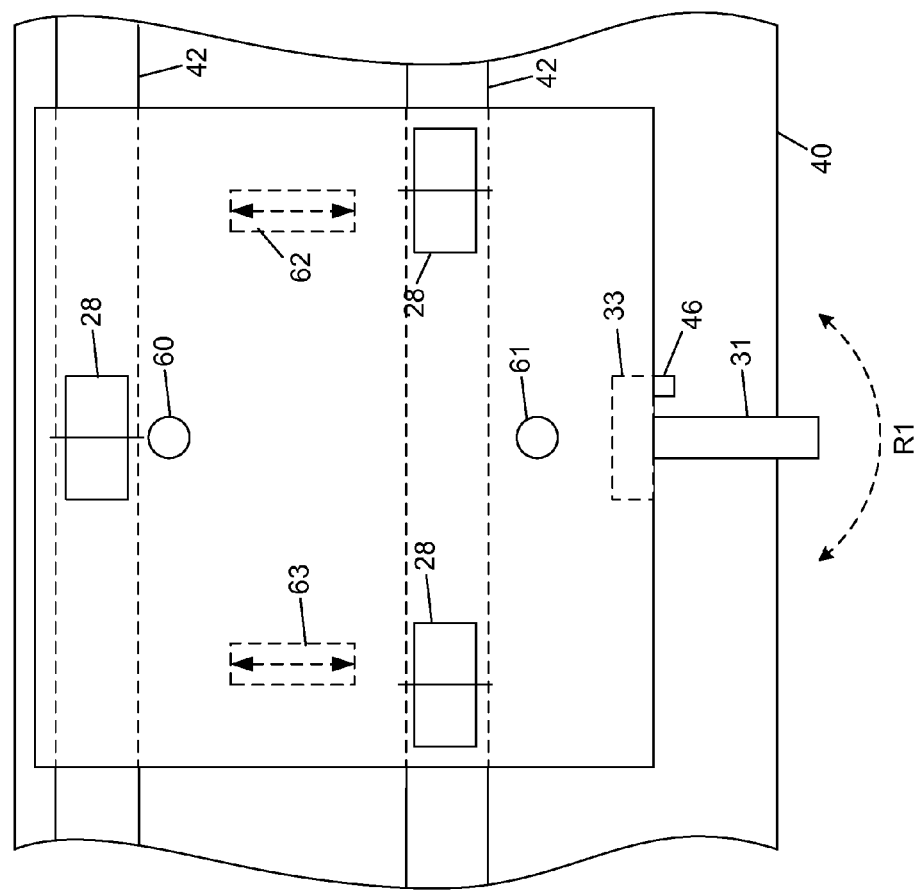
FIG. 9A depicts front view of a positional measurement system of a dispensing head according to one embodiment.

The dispensing head 16 may further include a bearing system 28 for running the dispensing head 16 around the track 22. The bearing system 28 may be a cam follower bearing or other type of bearing system. Because the bearing system 28 may cause the dispensing head 16 to lack the required positional accuracy, in one configuration the dispensing head 16 may be configured to measure its own position with respect to the track 22 or frame 40. This embodiment is shown in FIGS. 9A and 9B. In this embodiment, the dispensing head 16 may include a position sensing system 59 for sensing the position of the pick-and-place head 16 or the attachment mechanism of the pick-and-place head with respect to the track 22 that may include a first sensor 60, a second sensor 61, a third sensor 62, and a fourth sensor 63, which may be of the inductive, capacitive, laser or other distance measuring technology. In other embodiments, the position sensing system 59 may be a motion sensing system. The position sensing system 59 may be configured to sense the position, and/or the rotation, of the spindle 30 with respect to the track. The first and second sensors 60, 61 may be configured to determine rotation in a first plane, defined by rotation R1. The third and fourth sensors 62, 63 may be configured to determine rotation in a second plane that is perpendicular to the first plane, defined by rotation R2. Other embodiments may include more than four sensors. In one embodiment, six sensors may be utilized to continuously sense the position of the dispensing head 16 or the spindle 30 with respect to the track. This position sensing system 59 may provide sub-micron accuracy and may include a sub micron linear encoder head 64 that senses the position of the dispensing head 16 with respect to the track 22. Overall, this position sensing system 59 may enable the position of the nozzle 31 of the dispensing head 16 with respect to the track 22 or frame 40 to be known and corrected.

Moreover, a method is contemplated which may include providing a pick-and-place head such as the pick-and-place head 16. The method may include attaching the pick-and-place head to a track, such as the track 22, such that the pick-and-place head is moveable along the track. The method may include sensing, by the pick-and-place head, the position of the pick-and-place head with respect to the track. The method may then include picking up, by the pick-and-place head on the track, a component and placing, by the pick-and-place head, the component on an electronic assembly, such as the unfinished product or circuit board 18.

Figure 10:
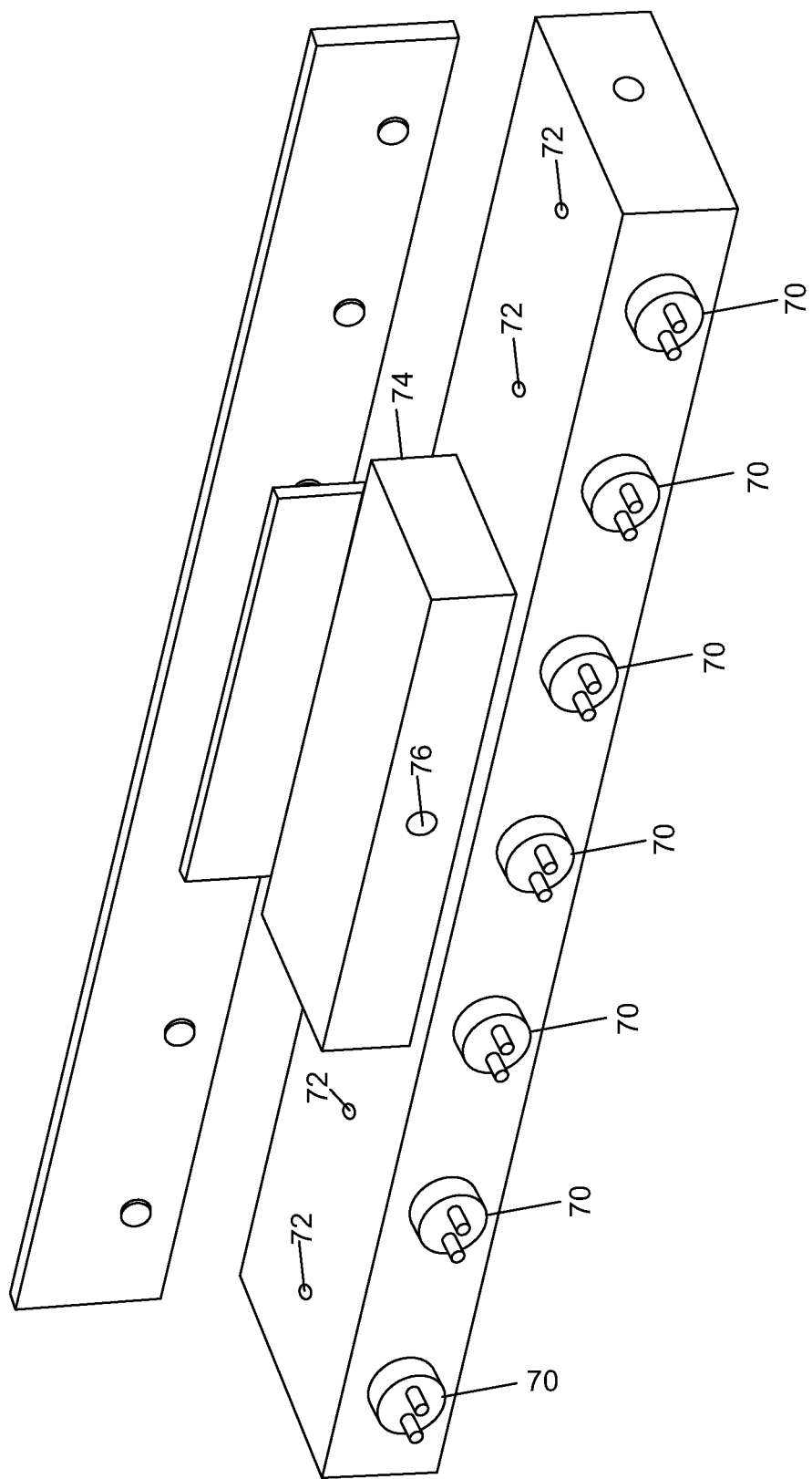
FIG. 10 depicts a compressed air valve system in a track configured to provide compressed air to a dispensing head according to one embodiment.

Referring back to FIG. 8, the dispensing head 16 may include an air seal 37 while the track 22 may include an air distribution system 43. This air distribution system 43 of the track 22 is shown in FIG. 10. In order to provide compressed air to the moving dispensing head 16, the dispensing head would either need its own compressed air supply, or have it provided by the track 22 or assembly machine 10. In the embodiment depicted, the track includes an air distribution system 43 which wraps around the entire track 22. The air distribution system 43 may be a conduit which includes air valves 70, shown in FIGS. 9A and 9B, in the track 22. As shown in FIG. 10, the air valves 70 may be spread across the track 22 at regular or non-regular locations where the dispensing head 16 may need to be activated. The track 22 may further include air transfer holes 72 through which the air is transferred to the dispensing head 16 once a valve 70 is opened. The dispensing head 16 may include a sliding shoe component 74 which receives the air and expels the air to the rest of the head out an opening 76. The valves 70 may be configured to open only when the sliding shoe component 74 of the dispensing head 16 is lined up with the valve 70. The air valves 70 may provide air from the air distribution system 43 to the dispensing head 16 for activation of the nozzle 31, for example. The valves 70 may be activated by a sensor that is triggered by the moving dispensing head 16, and particularly the sliding shoe component 74 of the dispensing head 16 being located over the valve 70. The sliding shoe component 74 or pocket may have a length that is greater than two times the distance between valves 70 to assure redundancy in the system. It should be understood that the air distribution system 43 may refer to any of the sliding shoe component 74, the valves 70, the air transfer holes 72, the nozzles 31, or the conduits within the track 22 (not shown) which distribute the air within the track. The air distribution system 43 may be configured to distribute air to the dispensing heads 16 at any location along the continuous circuitous track while the dispensing head 16 is moving or stationary. The air distribution system 43 may be configured to alternately provide air to the dispensing head at a plurality of locations along the track 22, but not at every location.

Moreover, an assembly method may include providing a continuous circuitous track, such as the track 22. The method may include providing a dispensing head, such as the dispensing head 16, attached to the continuous circuitous track. The method may include rotating the dispensing head around the track and distributing air by the track to the dispensing head. The method may include providing the dispensing heads with compressed air, and at least partially assembling, with the dispensing heads, an unfinished product, such as the unfinished product or circuit board 18.

The dispensing head 16 may include a nozzle 31. The nozzle 31 may be a vacuum or gripper nozzle. The nozzle 31 may be changeable with the tool or nozzle changer 36 in the dispensing head 16, or by visiting a stationary tool changer station, such as the tool changer 54, both well known in the art.

In one embodiment, the dispensing head 16 may be configured to move over the camera 56 located on the placement module 12, 84, 184, 212, 312, 412, 512 prior to placement. This may enable vision inspection and centering of the component. This camera 56 may be configured to take a picture of the component while the component is moving over the top of the camera by using a light feature to freeze the image in motion. After this picture is taken, the camera may now have obtained a picture of the component's features that need to be lined up with features on the unfinished product or circuit board 18. To be able to line up the features of the component with the unfinished product or circuit board, it is necessary to obtain the exact position of the placement head at the moment that the image was acquired by the camera 56 during the light flash. Since the connection to the dispensing head 16 consists of a bus, there is a latency in this connection and a new way of capturing the exact position of the head during the image acquisition is contemplated by the present disclosure. For this the placement head 16 may be equipped with a light-capture sensor 46 that is configured to detect a light flash from the camera 56 when it illuminates the component carried by the dispensing head 16 or an element of the dispensing head 16. This light sensor 46 is connected to the local control system on the dispensing head 16, which can instantly read the precise encoder position at the moment of the light flash of the dispenser head 16 by means of the encoder read head 33, also mounted on the dispensing head 16. Now the exact position of the dispensing head 16 during image acquisition can be transmitted over the bus to the placement module. This enables the X correction of the placement 12, 84, 184, 212, 312, 412, 512 by the placement head linear motor drive system 26, 38 and the Y correction by the product track 20 or the high accuracy transport system 85 for the unfinished product or circuit board 18.

A method may also include providing a dispensing head, such as the dispensing head 16. The method may include providing a control system located in the dispensing head. The method may include providing a light-capture sensor, such as the sensor 46, located in the dispensing head. The method may include providing a stationary camera, such as the camera 56. The method may include flashing a light by the stationary camera at the component on the dispensing head or flashing the light at an element of the dispensing head. The method may then include determining, by the control system, a precise encoder position at the moment of the flash of light. The method may also include at least partially assembling, by the dispensing head, an unfinished product, such as the unfinished product or circuit board 18.

The dispensing heads 16 of the present disclosure may be capable for picking and placing many types of components without impacting or reducing the overall speed of the system. Each dispensing head 16 may place components with all size ranges and dimensions. Spindle counts may also be reduced on each individual dispensing head 16 because the travel time to the board does not need to be amortized over many placements per head as is the case in state of the art systems. Creating heads with 12-30 spindles requires the component size capable of being accepted by a given dispensing head to be severely limited. Thus, in state of the art systems, many different heads are needed to place the entire range of components. Since the dispensing heads do not need to return, fewer spindles with larger component capabilities can be realized compared to other typical systems. Each dispensing head 16 may also be able to place components with a large placement force range. This allows for a machine where only one type of dispensing head 16 may enable high speed completion of the entire placement task.

It should be understood that other heads than the dispensing heads 16 disclosed herein may be utilized. For example, the heads 16 may be welding, screw driving, hammering, or the like. Moreover, other shapes for the end track module 52 and the mid track module 50 are contemplated for the track. Any shape track that will allow heads to cycle may be appropriate for the systems and machines disclosed herein.

In another embodiment, the system or assembly machine may not include a completely continuous track. Rather, there may be a turn-around mechanism at each end of a long straight track. This may be particularly advantageous in systems using only a single dispensing head. In one embodiment, a rotating mechanism may pick up a head and rotate the head by 90 or 180 degrees around a vertical axis and then drop the head back on the track. This may be able to create more compact cycles for heads, minimizing the footprint of the system.

In another embodiment, a dispensing head of the system may carry multiple spindles with multiple nozzles. The multiple spindles may allow for a dispensing head to pick up multiple components for placement during each cycle. For example, a dispensing head with three spindle assemblies may pick up three components from three different feeder banks before moving to the placement module. This may help to increase the potential output of the system or assembly machine for the same motion parameters and number of heads.

In yet another embodiment, the placement module 12, 84, 184, 212, 312, 412, 512 may contain its own control system for the entire assembly machine 10, 100, 200, 300, 400, 500. In the case of multiple stations (for example 12a and 12b in FIG. 1), one station is the master and may control the dispatching heads to take to tasks for other placement stations. In the embodiment shown in FIG. 1, for example, the placement module 12a may house the control system for the entire machine, while placement module 12b may be a slave placement module with a control system to control only the placement module 12b.

In another embodiment, the placement module 12, 84, 184, 212, 312, 412, 512 may contain two or more independently moving circuit board or other mounting surface tables. This dual or triple lane configuration (or more) may also cause the need for dual or triple product tracks 20 (or more). More than one lane may optimize the changeover time between circuit boards or other products. For example, the next circuit board may be placed in position while the first circuit board is being assembled. This may be particularly important for the case where the unfinished product or circuit board as a low number of components to be placed and thus short tact-time between circuit boards.

Figure 11:
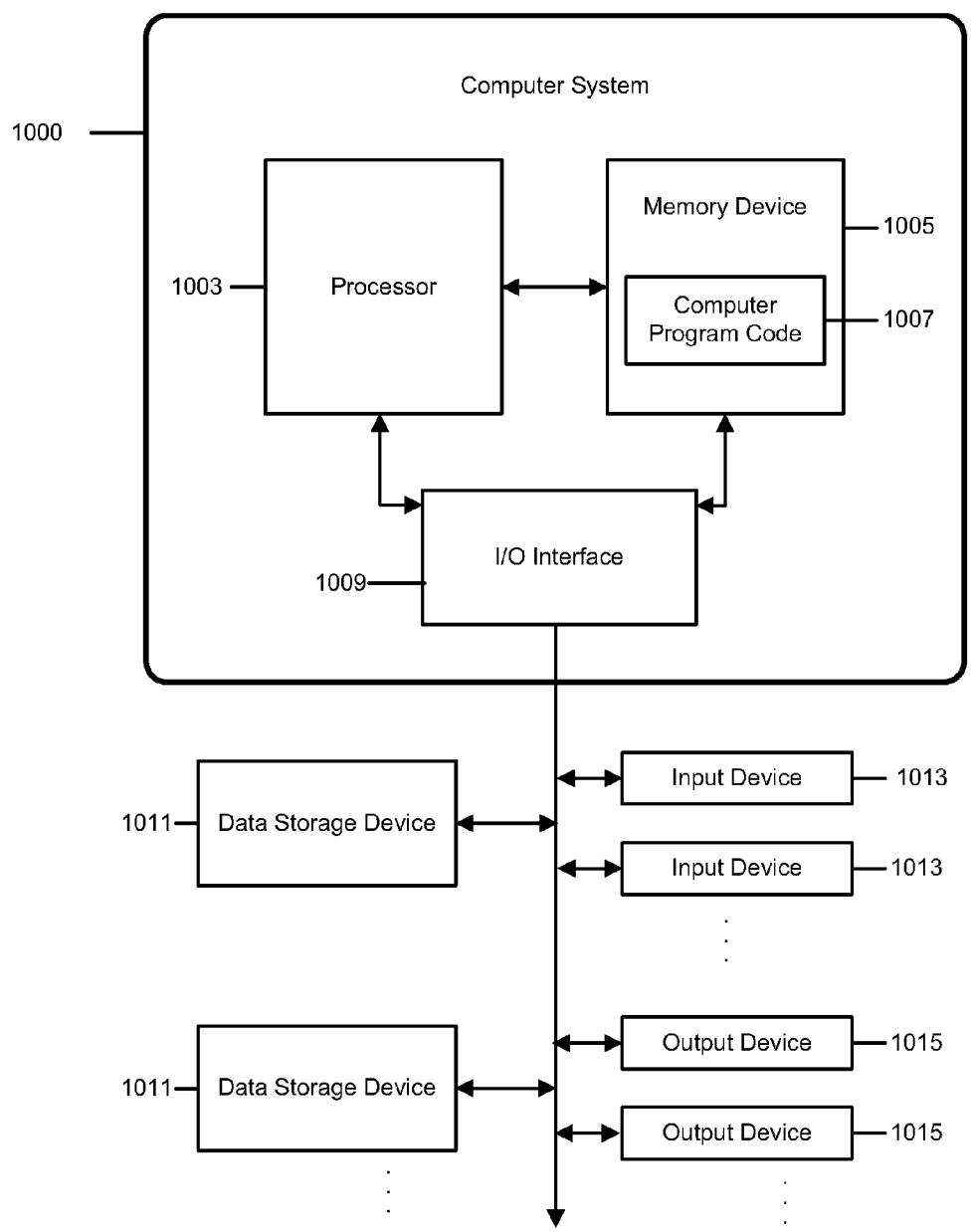
FIG. 11 depicts a control system according to one embodiment.

Referring now to FIG. 11, the structure of a computer system and computer program code that may be used to implement any of the methods described herein and which may represent the control system 1000 or alternately may represent any control or computer system located within the dispensing head 16.

Aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, in one embodiment, the present disclosure may take the form of a computer program product comprising one or more physically tangible (e.g., hardware) computer-readable medium(s) or devices having computer-readable program code stored therein, said program code configured to be executed by a processor of a computer or control system to implement the methods of the present invention. In one embodiment, the physically tangible computer readable medium(s) and/or device(s) (e.g., hardware media and/or devices) that store said program code, said program code implementing methods of the present invention, do not comprise a signal generally, or a transitory signal in particular.

Any combination of one or more computer-readable medium(s) or devices may be used. The computer-readable medium may be a computer-readable signal medium or a computer-readable storage medium. The computer-readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of the computer-readable storage medium or device may include the following: an electrical connection, a portable computer diskette, a hard disk, a random access memory (RAM), a read-only memory (ROM), an erasable programmable read-only memory (EPROM or flash memory), Radio Frequency Identification tag, a portable compact disc read-only memory (CD-ROM), an optical storage device, a magnetic storage device, or any suitable combination of the foregoing. In the context of this document, a computer-readable storage medium may be any physically tangible medium or hardware device that can contain or store a program for use by or in connection with an instruction execution system, apparatus, or device.

A computer-readable signal medium may include a propagated data signal with computer-readable program code embodied therein, for example, a broadcast radio signal or digital data traveling through an Ethernet cable. Such a propagated signal may take any of a variety of forms, including, but not limited to, electro-magnetic signals, optical pulses, modulation of a carrier signal, or any combination thereof.

Program code embodied on a computer-readable medium may be transmitted using any appropriate medium, including but not limited to wireless communications media, optical fiber cable, electrically conductive cable, radio-frequency or infrared electromagnetic transmission, etc., or any suitable combination of the foregoing.

Computer program code for carrying out operations for aspects of the present invention may be written in any combination of one or more programming languages, including, but not limited to programming languages like Java, Smalltalk, and C++, and one or more scripting languages, including, but not limited to, scripting languages like JavaScript, Perl, and PHP. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN), a wide area network (WAN), an intranet, an extranet, or an enterprise network that may comprise combinations of LANs, WANs, intranets, and extranets, or the connection may be made to an external computer (for example, through the Internet using an Internet Service Provider).

Aspects of the present disclosure are described above and below with reference to apparatus (systems) and computer program products according to embodiments of the present invention. It will be understood that the control system 1000 or dispensing head control system may be operationally implemented by computer program instructions. These computer program instructions may be provided to a processor of a general purpose computer, special purpose computer, or other programmable data-processing apparatus to produce a machine, such that the instructions, which execute via the processor of the computer or other programmable data-processing apparatus, create means for implementing the functions/acts specified in the flowchart and/or block diagram block or blocks.

These computer program instructions may also be stored in a computer-readable medium that can direct a computer, other programmable data-processing apparatus, or other devices to function in a particular manner, such that the instructions stored in the computer-readable medium produce an article of manufacture, including instructions that implement the function/act specified in the flowchart and/or block diagram block or blocks.

The computer program instructions may also be loaded onto a computer, other programmable data-processing apparatus, or other devices to cause a series of operational steps to be performed on the computer, other programmable apparatus, or other devices to produce a computer-implemented process such that the instructions that execute on the computer or other programmable apparatus provide processes for implementing the functions/acts specified in the flowchart and/or block diagram block or blocks.

In FIG. 11, the control system 1000 or dispensing head control system may comprise a processor 1003 coupled through one or more I/O Interfaces 1009 to one or more hardware data storage devices 1011 and one or more I/O devices 1013 and 1015.

Hardware data storage devices 1011 may include, but are not limited to, magnetic tape drives, fixed or removable hard disks, optical discs, storage-equipped mobile devices, and solid-state random-access or read-only storage devices. I/O devices may comprise, but are not limited to: input devices 1013, such as keyboards, scanners, handheld telecommunications devices, touch-sensitive displays, tablets, biometric readers, joysticks, trackballs, or computer mice; and output devices 1015, which may comprise, but are not limited to printers, plotters, tablets, mobile telephones, displays, or sound-producing devices. Data storage devices 1011, input devices 1013, and output devices 1015 may be located either locally or at remote sites from which they are connected to I/O Interface 1009 through a network interface.

Processor 1003 may also be connected to one or more memory devices 1005, which may include, but are not limited to, Dynamic RAM (DRAM), Static RAM (SRAM), Programmable Read-Only Memory (PROM), Field-Programmable Gate Arrays (FPGA), Secure Digital memory cards, SIM cards, or other types of memory devices.

At least one memory device 1005 contains stored computer program code 1007, which is a computer program that comprises computer-executable instructions. The stored computer program code includes a program that implements a method for the efficient selection of runtime rules for programmable search in accordance with embodiments of the present invention, and may implement other embodiments described in this specification. The data storage devices 1011 may store the computer program code 1007. Computer program code 1007 stored in the storage devices 1011 is configured to be executed by processor 1003 via the memory devices 1005. Processor 1003 executes the stored computer program code 1007.

Thus the present invention discloses a process for supporting computer infrastructure, integrating, hosting, maintaining, and deploying computer-readable code into the control system 1000 or dispensing head control system, wherein the code in combination with the control system 1000 or dispensing head control system may be capable of performing a method for the efficient selection of runtime rules for programmable search.

Any of the components of the present disclosure and the control system 1000 or dispensing head control system may be created, integrated, hosted, maintained, deployed, managed, serviced, supported, etc. by a service provider who offers to facilitate a method for the efficient selection of runtime rules for programmable search. Thus the present invention discloses a process for deploying or integrating computing infrastructure, comprising integrating computer-readable code into the control system 1000 or dispensing head control system, wherein the code in combination with the control system 1000 or dispensing head control system may be capable of performing a method for the efficient selection of runtime rules for programmable search.

One or more data storage units 1011 (or one or more additional memory devices not shown in FIG. 1) may be used as a computer-readable hardware storage device having a computer-readable program embodied therein and/or having other data stored therein, wherein the computer-readable program comprises stored computer program code 1007. Generally, a computer program product (or, alternatively, an article of manufacture) of control system 1000 or dispensing head control system may comprise said computer-readable hardware storage device.

While it is understood that program code 1007 for executing the methods described herein may be deployed by manually loading the program code 1007 directly into client, server, and proxy computers (not shown) by loading the program code 1007 into a computer-readable storage medium (e.g., computer data storage device 1011), program code 1007 may also be automatically or semi-automatically deployed into control system 1000 or dispensing head control system by sending program code 1007 to a central server (e.g., control system 1000 or dispensing head control system) or to a group of central servers. Program code 1007 may then be downloaded into client computers (not shown) that will execute program code 1007.

Alternatively, program code 1007 may be sent directly to the client computer via e-mail. Program code 1007 may then either be detached to a directory on the client computer or loaded into a directory on the client computer by an e-mail option that selects a program that detaches program code 1007 into the directory.

Another alternative is to send program code 1007 directly to a directory on the client computer hard drive. If proxy servers are configured, the process selects the proxy server code, determines on which computers to place the proxy servers' code, transmits the proxy server code, and then installs the proxy server code on the proxy computer. Program code 1007 is then transmitted to the proxy server and stored on the proxy server.

In one embodiment, program code 1007 for executing the methods described herein is integrated into a client, server and network environment by providing for program code 1007 to coexist with software applications (not shown), operating systems (not shown) and network operating systems software (not shown) and then installing program code 1007 on the clients and servers in the environment where program code 1007 will function.

The first step of the aforementioned integration of code included in program code 1007 is to identify any software on the clients and servers, including the network operating system (not shown), where program code 1007 will be deployed that are required by program code 107 or that work in conjunction with program code 1007. This identified software includes the network operating system, where the network operating system comprises software that enhances a basic operating system by adding networking features. Next, the software applications and version numbers are identified and compared to a list of software applications and correct version numbers that have been tested to work with program code 1007. A software application that is missing or that does not match a correct version number is upgraded to the correct version.

A program instruction that passes parameters from program code 1007 to a software application is checked to ensure that the instruction's parameter list matches a parameter list required by the program code 1007. Conversely, a parameter passed by the software application to program code 1007 is checked to ensure that the parameter matches a parameter required by program code 1007. The client and server operating systems, including the network operating systems, are identified and compared to a list of operating systems, version numbers, and network software programs that have been tested to work with program code 1007. An operating system, version number, or network software program that does not match an entry of the list of tested operating systems and version numbers is upgraded to the listed level on the client computers and upgraded to the listed level on the server computers.

After ensuring that the software, where program code 1007 is to be deployed, is at a correct version level that has been tested to work with program code 1007, the integration may be completed by installing program code 1007 on the clients and servers.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms. The terms "first" and "second" are used to distinguish elements and are not used to denote a particular order.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A dispensing head comprising:
   a control system located in the dispensing head;
   an encoder read head located in the dispensing head; and
   a light-capture sensor located in the dispensing head
      configured to detect a light flash of a stationary camera when the light flash illuminates a component on the dispensing head or an element of the dispensing head;
   wherein the control system is configured to determine a precise encoder position with the encoder read head at a moment of the light flash;
   wherein the dispensing head is configured to at least partially assemble an unfinished product.

2. The dispensing head of claim 1, wherein the dispensing head is a pick-and-place head having a nozzle configured to pick and place the component on a circuit board.

3. The dispensing head of claim 1, wherein the dispensing head is attachable to a circuitous track such that the dispensing head is movable around the circuitous track.

4. The dispensing head of claim 3, wherein the dispensing head includes at least one of an iron core coil unit and a permanent magnet, and wherein the at least one of the iron core coil unit and the permanent magnet are configured to provide attachment of the dispensing head to the circuitous track and provide movement of the dispensing head about the circuitous track.

5. The dispensing head of claim 1, wherein the control system is configured to determine the precise location of the component.

6. The dispensing head of claim 1, wherein the control system is configured to transmit the precise encoder position to a placement module separate from the dispensing head.

7. A method comprising:
providing a dispensing head;
providing a control system located in the dispensing head;
providing an encoder read head located in the dispensing head;
providing a light-capture sensor located in the dispensing head;
providing a stationary camera;
flashing a light by the stationary camera at a component on the dispensing head or an element of the dispensing head;
determining, by the control system and the encoder read head, a precise encoder position at the moment of the flash of light; and
at least partially assembling, by the dispensing head, an unfinished product.

8. The method of claim 7, wherein the dispensing head is a pick-and-place head having a nozzle configured to pick and place the component on a circuit board.

9. The method of claim 7, further comprising attaching the dispensing head to a circuitous track and moving the dispensing head around the circuitous track.

10. The method of claim 9, further comprising mounting the stationary camera on the circuitous track and providing the flash of light at a predetermined location along the circuitous track.

11. The method of claim 9, further comprising determining, by the control system, the precise location of the component.

12. The method of claim 9, wherein the dispensing head includes at least one of an iron core coil unit and a permanent magnet, the method further comprising attaching the dispensing head to the circuitous track with the at least one of the iron core coil unit and the permanent magnet, the method further comprising moving the dispensing head about the circuitous track with the at least one of the iron core coil unit and the permanent magnet.

13. The method of claim 7, further comprising transmitting, with the control system, the precise encoder position to a placement module separate from the dispensing head.

14. An assembly machine comprising:
a circuitous track including a placement module and a stationary camera mounted on the circuitous track;
a dispensing head attachable to the circuitous track such that the dispensing head is moveable around the circuitous track, the dispensing head including:
a control system located in the dispensing head;
an encoder read head located in the dispensing head; and
a light-capture sensor located in the dispensing head configured to detect a light flash of a stationary camera when the light flash illuminates a component on the dispensing head or an element of the dispensing head;
wherein the control system is configured to determine a precise encoder position with the encoder read head at a moment of the light flash;
wherein the dispensing head is configured to at least partially assemble an unfinished product located on the placement module.

15. The assembly machine of claim 14, wherein the dispensing head is a pick-and-place head having a nozzle configured to pick and place the component on a circuit board.

16. The assembly machine of claim 14, wherein the stationary camera is configured to provide the flash of light at a predetermined location along the circuitous track.

17. The assembly machine of claim 14, wherein the control system is configured to determine the precise location of the component.

18. The assembly machine of claim 14, wherein the dispensing head includes at least one of an iron core coil unit and a permanent magnet, and wherein the at least one of the iron core coil unit and the permanent magnet are configured to provide attachment of the dispensing head to the circuitous track and provide movement of the dispensing head about the circuitous track.

19. The assembly machine of claim 14, wherein the control system is configured to transmit the precise encoder position to the placement module.

* * * * *